(12) United States Patent
Morimoto et al.

(10) Patent No.: US 12,389,696 B2
(45) Date of Patent: Aug. 12, 2025

(54) PHOTOELECTRIC CONVERSION APPARATUS

(71) Applicant: CANON KABUSHIKI KAISHA, Tokyo (JP)

(72) Inventors: Kazuhiro Morimoto, Kanagawa (JP); Junji Iwata, Tokyo (JP); Yu Maehashi, Tokyo (JP); Hiroshi Sekine, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 510 days.

(21) Appl. No.: 17/899,143

(22) Filed: Aug. 30, 2022

(65) Prior Publication Data

US 2023/0071669 A1    Mar. 9, 2023

(30) Foreign Application Priority Data

Sep. 6, 2021   (JP) ................. 2021-144928

(51) Int. Cl.
*H10F 39/18*    (2025.01)
*H10F 39/00*    (2025.01)

(52) U.S. Cl.
CPC ......... *H10F 39/8033* (2025.01); *H10F 39/18* (2025.01); *H10F 39/805* (2025.01); *H10F 39/807* (2025.01)

(58) Field of Classification Search
None
See application file for complete search history.

(56) References Cited

U.S. PATENT DOCUMENTS

| | | | |
|---|---|---|---|
| 9,312,401 B2* | 4/2016 | Webster | H10F 39/809 |
| 9,881,963 B1* | 1/2018 | Chen | H10F 39/807 |
| 2011/0073762 A1 | 3/2011 | Soma | |
| 2015/0200222 A1* | 7/2015 | Webster | H10F 30/225 |
| | | | 250/208.1 |
| 2016/0276427 A1* | 9/2016 | Yamashita | H10D 30/668 |

(Continued)

FOREIGN PATENT DOCUMENTS

| | | |
|---|---|---|
| JP | 2011077165 A | 4/2011 |
| JP | 2021002542 A | 1/2021 |
| JP | 2021027358 A | 2/2021 |

(Continued)

*Primary Examiner* — Bilkis Jahan
(74) *Attorney, Agent, or Firm* — Canon U.S.A., Inc. IP Division

(57) ABSTRACT

An apparatus includes a plurality, of avalanche diodes disposed in a layer having a first surface and a second surface opposite the first surface, wherein the plurality of avalanche diodes each includes a first region of first conductivity type located at a first depth, a second region of second conductivity type located at a second depth greater than the first depth with respect to the second surface, and a third region of the second conductivity type located at a third depth greater than the second depth with respect to the second surface, wherein the layer includes a plurality of structures disposed in the first surface, and wherein the plurality of structures has an effective period less than $hc/E_a$ (h: Planck's constant [J·s], c: speed of light [m/s], and $E_a$: a band gap of a substrate [J]).

30 Claims, 29 Drawing Sheets

(56) References Cited

U.S. PATENT DOCUMENTS

2019/0326450 A1\* 10/2019 Iwata ................... H04N 25/773
2020/0028000 A1    1/2020 Wang

FOREIGN PATENT DOCUMENTS

| | | |
|---|---|---|
| JP | 2021034559 A | 3/2021 |
| JP | 2021061330 A | 4/2021 |
| JP | 2021100058 A | 7/2021 |
| WO | 2020170841 A1 | 8/2020 |

\* cited by examiner

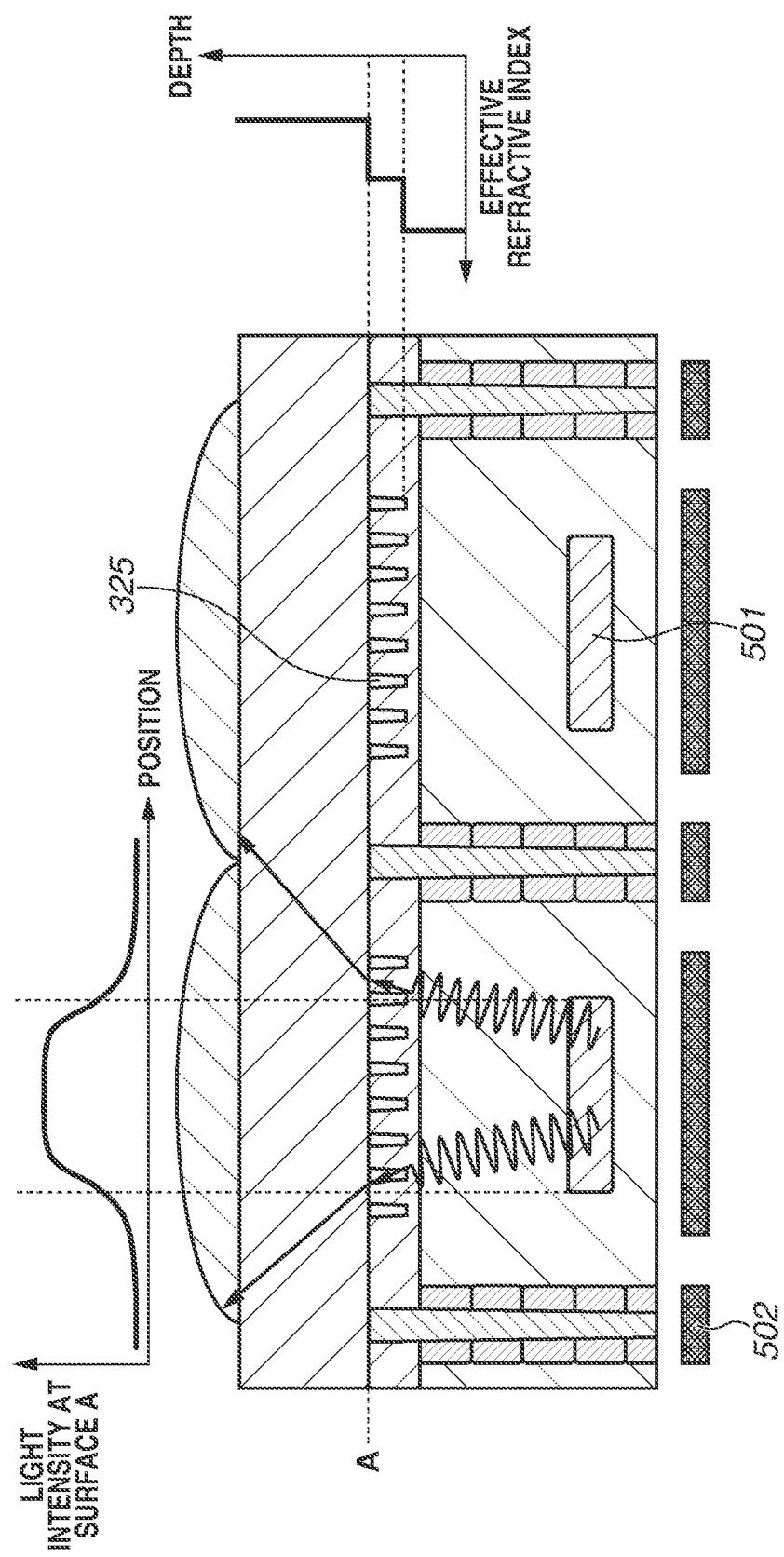

SIDE-TO-SIDE CROSS SECTION

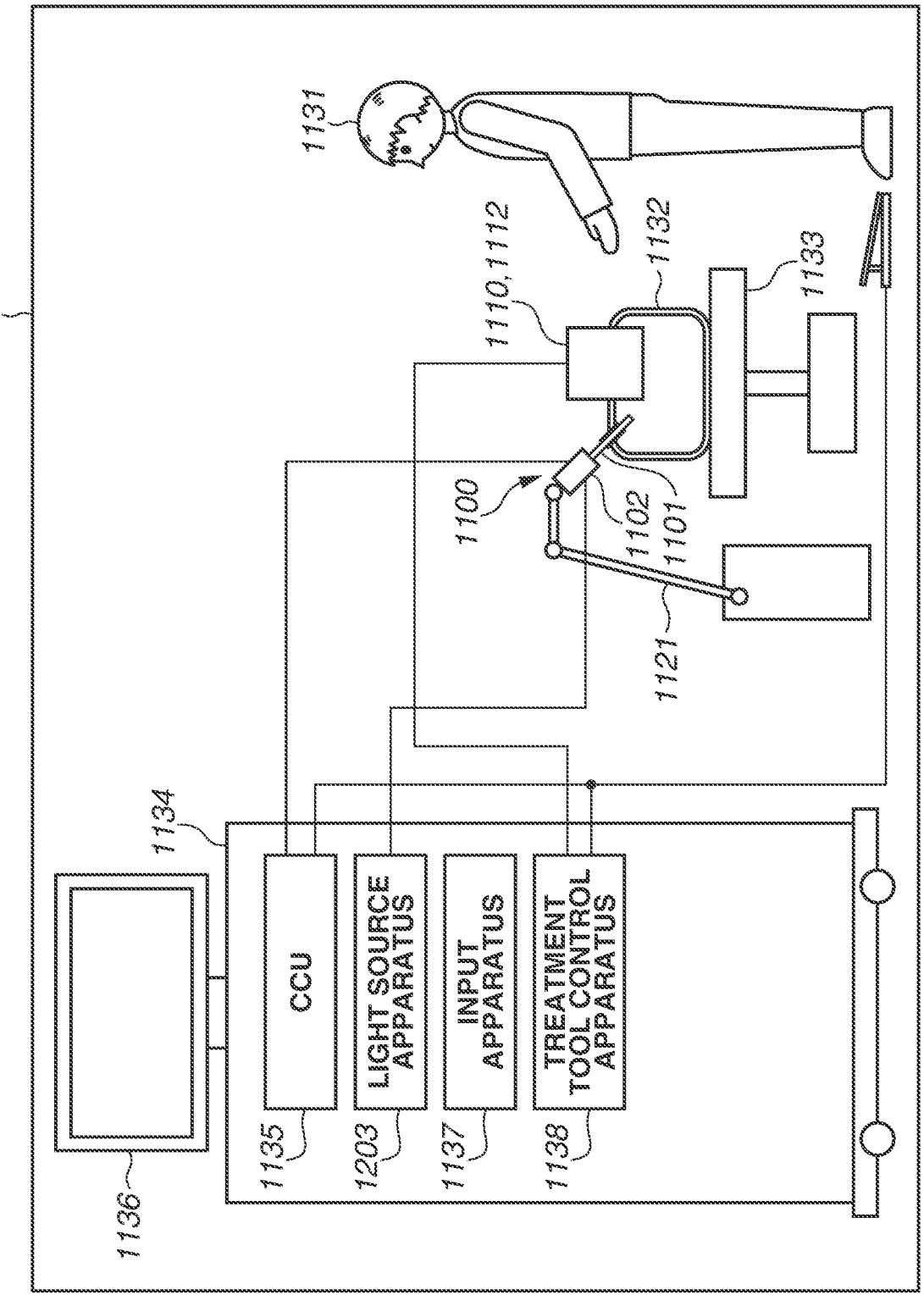

PHOTOELECTRIC CONVERSION APPARATUS

TECHNICAL FIELD

The aspect of the embodiments relates to a photoelectric conversion apparatus and a photoelectric conversion system.

DESCRIPTION OF THE RELATED-ART

There is a photoelectric conversion apparatus including patterned structures disposed at light receiving surfaces of photoelectric conversion elements to refract incident light, whereby optical lengths of the incident light in the photoelectric conversion elements are increased for improved quantum efficiency, Japanese Patent Application Laid-Open No, 2021-002542 discusses a single-photon avalanche diode (SPAD) including a patterned structure called moth-eye structure on the light incident surface side of its substrate.

SUMMARY

According to an aspect of the embodiments, an apparatus includes a plurality of avalanche diodes disposed in a layer having a first surface and a second surface opposite the first surface, wherein the plurality of avalanche diodes each includes a first region of first conductivity type located at a first depth, a second region of second conductivity type located at a second depth greater than the first depth with respect to the second surface, and a third region of the second conductivity type located at a third depth greater than the second depth with respect to the second surface, wherein the layer includes a plurality of structures disposed in the first surface, and wherein the plurality of structures has an effective period less than $hc/E_a$ (h: Planck's constant [J·s], c: speed of light [m/s], and $E_a$: a band gap of a substrate [J]).

According to another aspect of the embodiments, an apparatus includes a plurality of avalanche diodes disposed in a layer having a first surface and a second surface opposite the first surface, wherein the plurality of avalanche diodes each includes a first region of first conductivity type located at a first depth, a second region of second conductivity type located at a second depth greater than the first depth with respect to the second surface, and a third region of the second conductivity type located at a third depth greater than the second depth with respect to the second surface, wherein the layer includes a plurality of structures disposed in the first surface, and wherein the plurality of structures has an effective period less than 1.1 μm.

Further features of the disclosure will become apparent from the following description of exemplary embodiments with reference to the attached drawings.

BRIEF DESCRIPTION OF THE DRAWINGS

FIG. 11 illustrates a cross section of the photoelectric conversion elements according to the first exemplary embodiment.

FIG. 28 is a functional block diagram of a photoelectric conversion system according to an eleventh exemplary embodiment.

DESCRIPTION OF THE EMBODIMENTS

Figure 1:
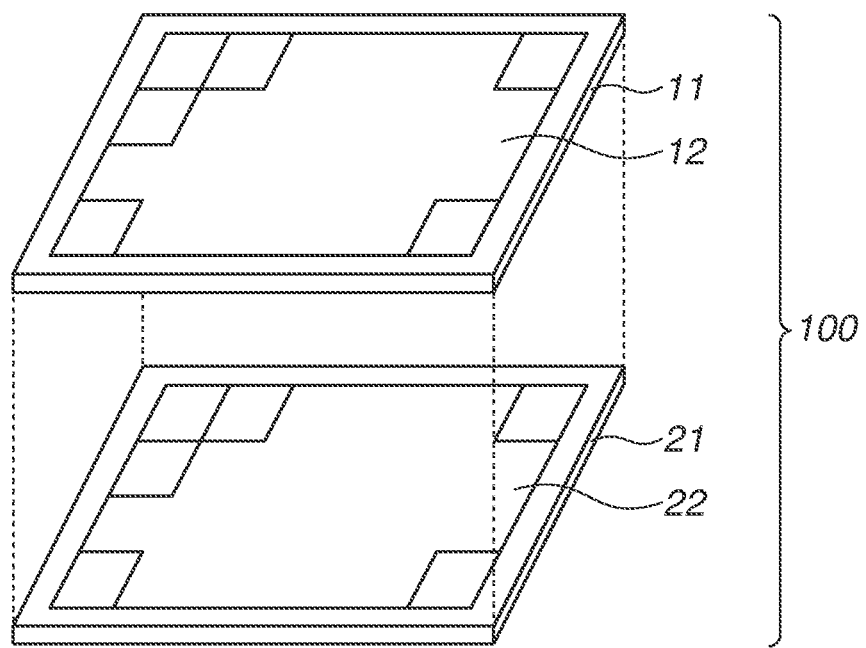
FIG. 1 is a schematic diagram illustrating a photoelectric conversion apparatus according to an exemplary embodiment.

The modes described below are intended to embody the technical concept of the disclosure and not limit the disclosure. For clarity of description, members illustrated in the drawings may be exaggerated in size and/or positional relationship. In the following description, similar components may be denoted by the same reference numerals, and a description thereof may be omitted.

Exemplary embodiments of the disclosure will be described in detail below with reference to the drawings. In the following description, terms describing specific directions or positions (such as "up", "down", "right", and "left" and other phrases including these terms) are used as appropriate. Such terms and phrases are used to facilitate the understanding of the exemplary embodiments with reference to the drawings, and the technical scope of the disclosure are not limited by the meanings of the terms or phrases.

As employed herein, a plan view refers to a view taken in a direction perpendicular the light incident surface of a semiconductor layer. A cross section refers to a plane in the direction perpendicular to the light incident surface of the semiconductor layer. If the light incident surface of the semiconductor layer is microscopically rough, the plan view is defined with reference to the light incident surface of the semiconductor layer seen microscopically.

In the following description, the anode of an avalanche photodiode (APD) is fixed to a potential, and a signal is taken out of the cathode. A semiconductor region of first conductivity type where charges having the same polarity as that of the signal char are the majority carriers thus refers to urn N-type semiconductor region, A semiconductor region of second conductivity type where charges having the opposite polarity to that of the signal charge are the majority carriers refers to a P-type semiconductor region.

An exemplary embodiment of the disclosure also holds if the cathode of an APD is fixed to a potential and a signal is taken out of the anode. In such a case, a semiconductor region of the first conductivity type where charges having the same polarity as that of the signal charge are the majority carriers refers to a P-type semiconductor region. A semiconductor region of the second conductivity type where charges having the opposite polarity to that of the signal charge are the majority carriers refers to an N-type semiconductor region. While in the following description either one of the nodes of an APD is fixed to a potential, both nodes may be variable in potential.

As employed herein, a simple phrase "impurity concentration" refers to the net impurity concentration compensated for impurities of opposite conductivity type. In other words, the "impurity concentration" refers to a net doping concentration. A region where the P-type impurity doping concentration is higher than the N-type impurity doping concentration is a P-type semiconductor region. On the other hand, a region where the N-type impurity doping concentration is higher than the P-type impurity doping concentration is an N-type semiconductor region.

A configuration common to exemplary embodiments of a photoelectric conversion apparatus and a driving method thereof according to the disclosure will be described with reference to FIGS. 1 to 5C.

FIG. 1 is a diagram illustrating a configuration of a stacked photoelectric conversion apparatus 100 according to an exemplary embodiment of the disclosure.

The photoelectric conversion apparatus 100 includes two substrates, namely, a sensor substrate 11 and a circuit substrate 21 that are stacked and electrically connected to each other. The sensor substrate 11 includes a first semiconductor layer including photoelectric conversion elements 102 to be described below, and a first wiring structure. The circuit substrate 1 includes a second semiconductor layer including circuits such as signal processing units 103 to be described below, and a second wiring structure. The photoelectric conversion apparatus 100 is constituted by stacking the second semiconductor layer, the second wiring structure, the first wiring structure, and the first semiconductor layer in this order. The photoelectric conversion apparatus described in each of the following exemplary embodiments is a back-illuminated photoelectric conversion apparatus on a first side of which light is incident and on a second side of which the circuit substrate is located.

In the following description, the sensor substrate 11 and the circuit substrate 21 are described as diced chips. However, the sensor substrate 11 and the circuit substrate 21 are not limited to chips. For example, the substrates may be wafers. The substrates in a wafer state may be stacked before dicing. Diced chips may be stacked and bonded.

The sensor substrate 11 includes a pixel region 12. The circuit substrate 21 includes a circuit region 22 for processing signals detected in the pixel region 12.

Figure 2:
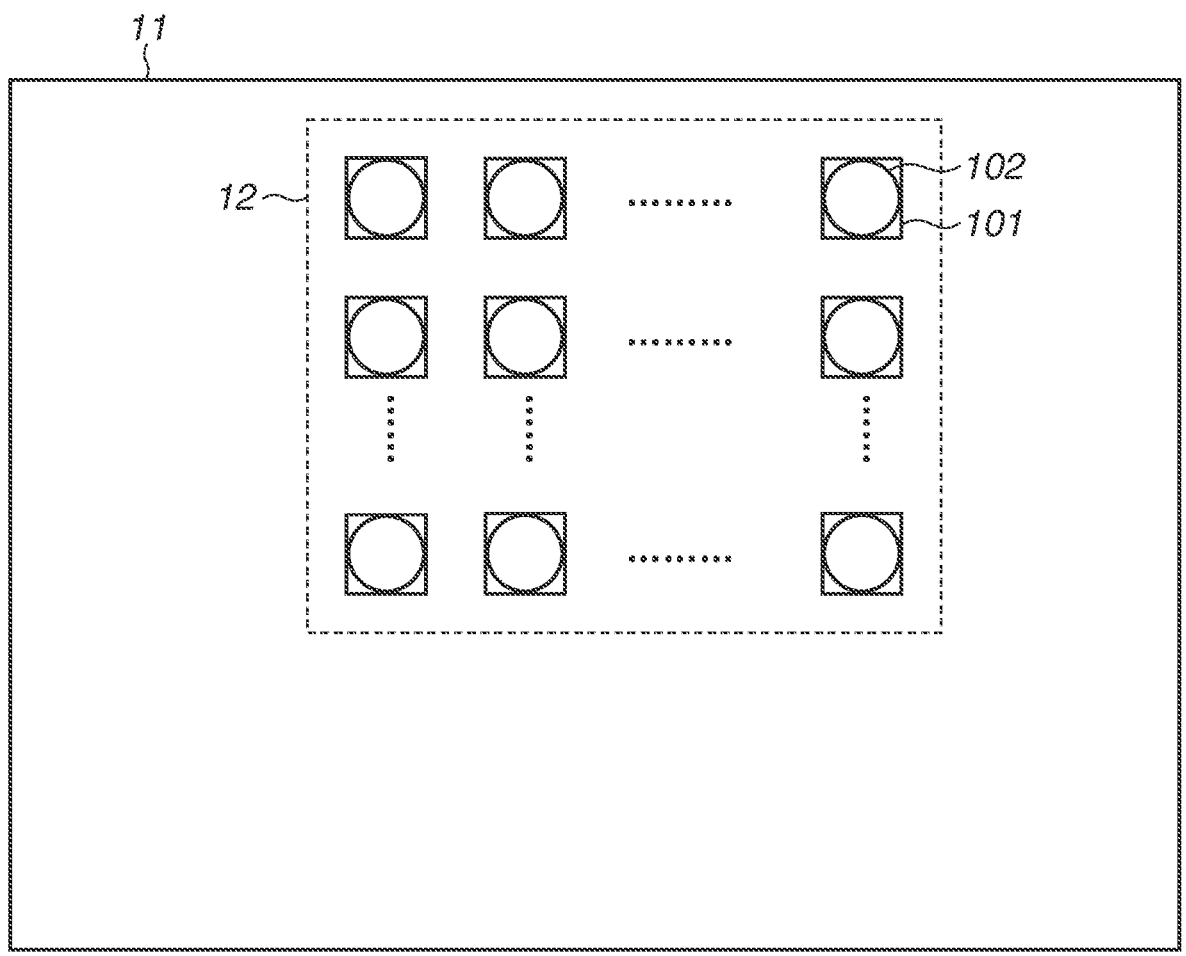
FIG. 2 is a schematic diagram illustrating a photodiode (PD) substrate (sensor substrate) of the photoelectric conversion apparatus according to the exemplary embodiment.

FIG. 2 is a diagram illustrating a layout example of the sensor substrate 11. Pixels 101 each including a photoelectric conversion element 102 including an APD are arranged in a two-dimensional array in a plan view, whereby the pixel region 12 is formed.

Typically, the pixels 101 are pixels for forming an image. However, in time of flight (TOF) applications, the pixels 101 do not necessarily need to form an image. More specifically, the pixels 101 may be pixels for measuring the time of arrival of light and the amount of the light.

Figure 3:
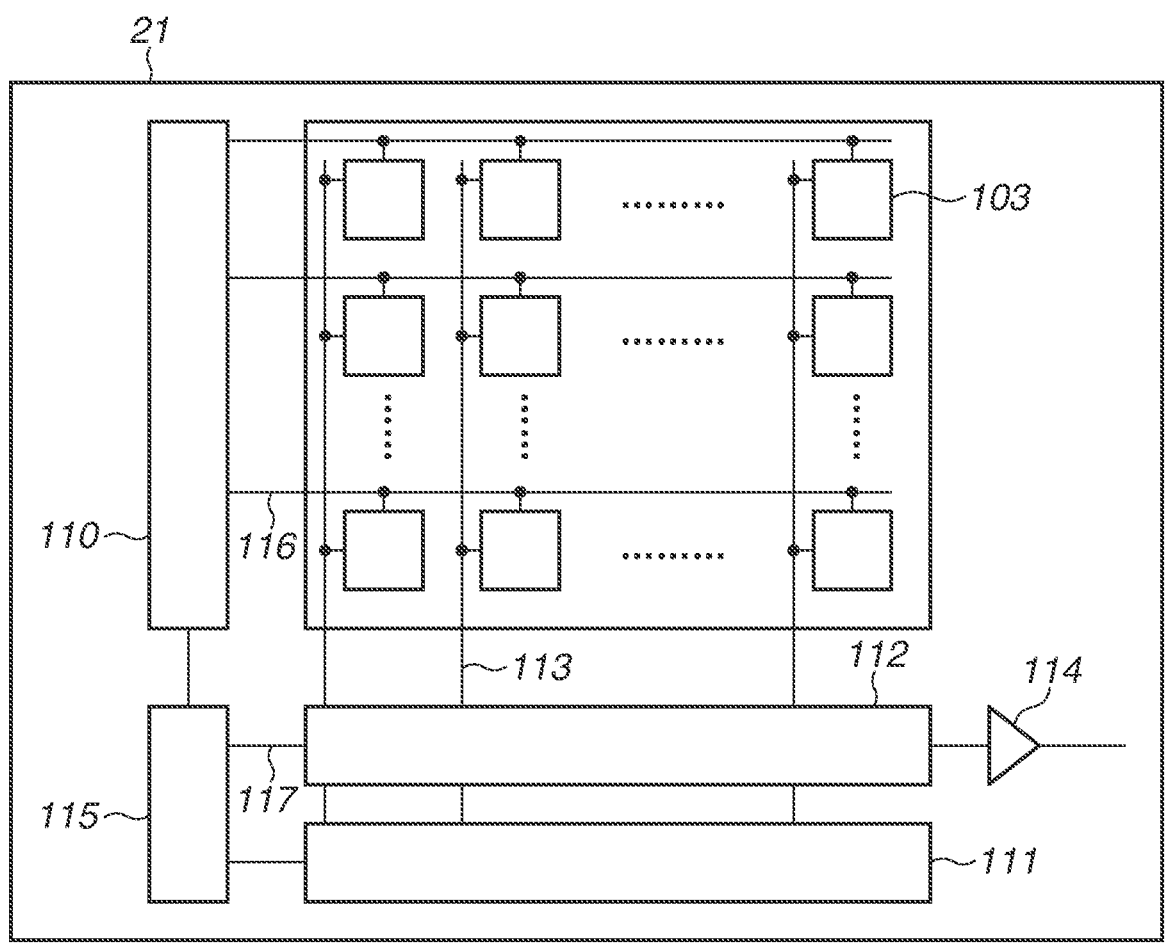
FIG. 3 is a schematic diagram illustrating a circuit substrate of the photoelectric conversion apparatus according to the exemplary embodiment.

FIG. 3 is a configuration diagram of the circuit substrate 21. The circuit substrate 21 includes signal processing units 103 for processing charges photoelectrically converted by the photoelectric conversion elements 102 of FIG. 2, a reading circuit (column circuit) 112, a control pulse generation unit 115, a horizontal scanning circuit unit 111, signal lines 113, and, a vertical scanning circuit unit 110.

The photoelectric conversion elements 102 of FIG. 2 and the signal processing units 103 of FIG. 3 are electrically connected via connection wiring disposed pixel by pixel.

The vertical scanning circuit unit 110 receives control pulses supplied from the control pulse generation unit 115 and supplies the control pulses to the pixels 101. Logic circuits such as a shift register and an address decoder are used for the vertical scanning circuit unit 110.

The signals output from the photoelectric conversion elements 102 of the pixels 101 are processed by the signal processing units 103. The signal processing units 103 each include a counter and a memory. The memory stores a digital value (digital signal).

The horizontal scanning circuit unit 111 inputs control pulses for sequentially selecting columns to the signal processing units 103 to read the digital signals stored in the memories of the respective pixels.

The signal processing unit 103 of the pixel selected by the vertical scanning circuit unit 110 in the selected column outputs the signal (digital signal) to the signal line 113.

The signal output to the signal line 113 is output to a recording unit or signal processing unit outside the photoelectric conversion apparatus 100 via the output circuit 114.

In FIG. 2, the photoelectric conversion elements 102 may be one-dimensionally arranged in the pixel region 12. The effects of the present exemplary embodiment can be obtained even with one pixel 101, and the case with one pixel 101 is also included in the disclosure. The functions of the signal processing units 103 do not necessarily need to be provided for all the photoelectric conversion elements 102 on a one-on-one basis. For example, a plurality of photoelectric conversion elements 102 may share one signal processing unit 103 and the signal processing may be sequentially performed.

As illustrated in FIGS. 2 and 3, the plurality of signal processing units 103 is disposed in a region overlapping the pixel region 12 in a plan view. The vertical scanning circuit unit 110, the horizontal scanning circuit unit 111, the column circuit 112, the output circuit 114, and the control pulse generation unit 115 are disposed to overlap the area between the ends of the sensor substrate 11 and the ends of the pixel region 12 in a plan view. In other words, the sensor substrate 11 includes the pixel region 12 and a non-pixel region located around the pixel region 12. The vertical scanning circuit unit 110, the horizontal scanning circuit unit 111, the column circuit 112, the output circuit 114, and the control pulse generation unit 115 are disposed in an area overlapping the non-pixel region in a plan view.

Figure 4:
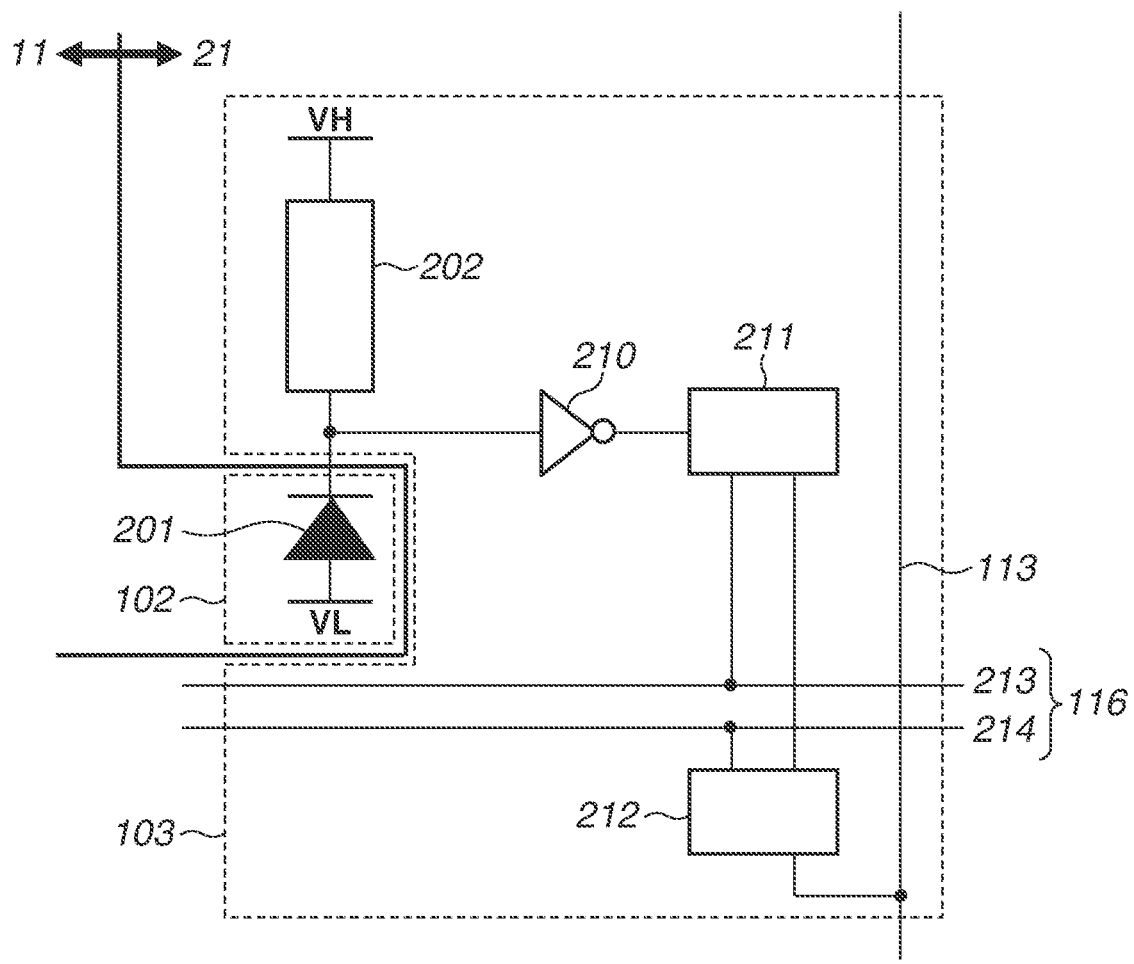
FIG. 4 illustrates a configuration example of a pixel circuit of the photoelectric conversion apparatus according to the exemplary embodiment.

FIG. 4 is an example of a block diagram including an equivalent circuit of FIGS. 2 and 3.

In FIG. 2, the photoelectric conversion elements 102 including the APDs 201 are disposed on the sensor substrate 11. The other members are disposed on the circuit substrate 21.

Each APD 201 generates charge pairs corresponding to incident light by photoelectrical conversion. A voltage VL (first voltage) is supplied to the anode of the APD 201. A voltage VH (second voltage) higher than the voltage VL supplied to the anode is supplied to the cathode of the APD 201. A reverse bias voltage for causing an avalanche multiplication operation of the APD 201 is supplied to the anode and the cathode. With such a voltage supplied, the charges generated by the incident light cause avalanche multiplication to generate an avalanche current.

The reverse bias voltage can be supplied in a Geiger mode and a linear mode. In the Geiger mode, the APD 201 operates with a potential difference greater than the breakdown voltage between the anode and the cathode. In the linear mode, the APD 201 operates with a potential difference near the breakdown voltage or less between the anode and the cathode.

An APD operating in the Geiger mode is referred to as a single-photon avalanche diode (SPAD). For example, the voltage VI. (first voltage) is −30 V, and the voltage VH (second voltage) is 1 V. The APD 201 may be operated in the linear mode or the Geiger mode. The SPAD is used since the SPAD has a high potential difference and a significant withstanding effect compared to the APD in the linear node.

A quenching element 202 is connected to a power supply for supplying the voltage VH and the APD 201. In multiplying a signal by avalanche multiplication, the quenching element 202 functions as a load circuit (quenching circuit) to reduce the voltage supplied to the APD 201 and suppress the avalanche multiplication (quenching operation), The quenching element 202 also has the function of restoring the voltage supplied to the APD 201 to the voltage VH (recharging operation) by passing a current as much as the voltage drop caused by the quenching operation.

The signal processing unit 103 includes a waveform shaping unit 210, a counter circuit 211, and a selection circuit 212. As employed herein, the signal processing unit 103 includes at least any one of the waveform shaping unit 210, the counter circuit 211, and the selection circuit 212.

The waveform shaping unit 210 shapes the waveform of a change occurring in the potential of the cathode of the APD 201 upon detection of a photon and outputs a pulse signal. An example of the waveform shaping unit 210 is an inverter circuit. FIG. 4 illustrates an example where an inverter is used as the waveform shaping unit 210, whereas a circuit including a plurality of inverters connected in series may be used. Other circuits having the waveform shaping effect may be used.

The counter circuit 211 counts the pulse signal output from the waveform shaping unit 210 and holds the count value. The signal (count value) held in the counter circuit 211 is reset when a control pulse pRES is supplied via a drive line 213.

A control pulse pSEL is supplied from the vertical scanning circuit unit 110 of FIG. 3 to the selection circuit 212 via a drive line 214 of FIG. 4 (not illustrated in FIG. 3). The selection circuit 212 switches electrical connection and disconnection between the counter circuit 211 and the signal line 113. The selection circuit 212 includes a buffer circuit for outputting a signal, for example.

Switches such as a transistor may be disposed between the quenching element 202 and the APD 201 and between the photoelectric conversion element 102 and the signal processing unit 103 to switch the electrical connection. Similarly, the supply of the voltage VH or VL to the photoelectric conversion element 102 may be electrically switched using a switch such as a transistor.

The present exemplary embodiment is described with the configuration using the counter circuit 211. However, the photoelectric conversion apparatus 100 may be configured to obtain pulse detection timing by using a time-to-digital conversion circuit (time-to-digital converter: TDC) and a memory instead of the counter circuits 211 this case, the generation timing of the pulse signal output from the waveform shaping unit 210 is converted into a digital signal by the TDC. To measure the timing of the pulse signal, a control pulse pREF (reference signal) is supplied from the vertical scanning circuit unit 110 of FIG. 1 to the TDC via a drive line. The TDC obtains a digital signal indicating the input timing of a signal output from each pixel 101 via the waveform shaping unit 210 in terms of relative time with reference to the control pulse pREF.

Figure 5A:
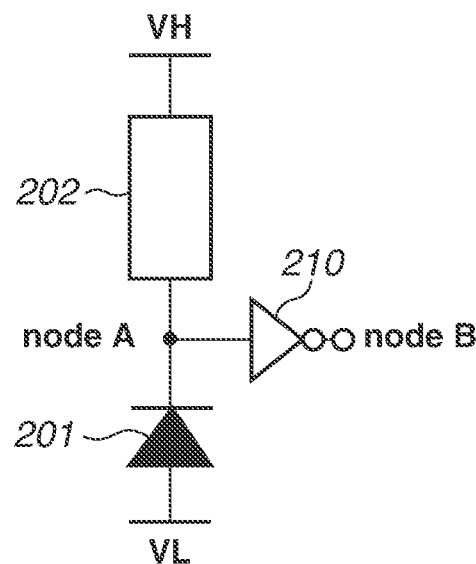
FIGS. 5A, 5B, and 5C are schematic diagrams illustrating driving of the pixel circuit of the photoelectric conversion apparatus according to the exemplary embodiment.
Figure 5B:
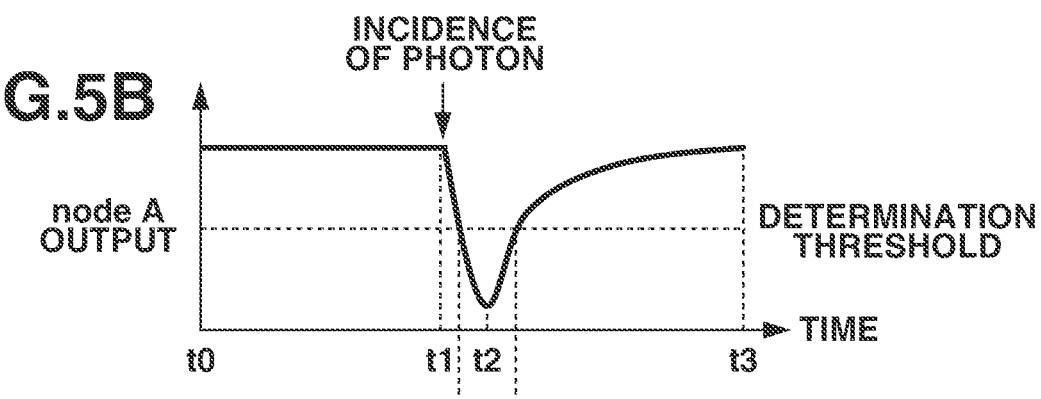
Figure 5C:
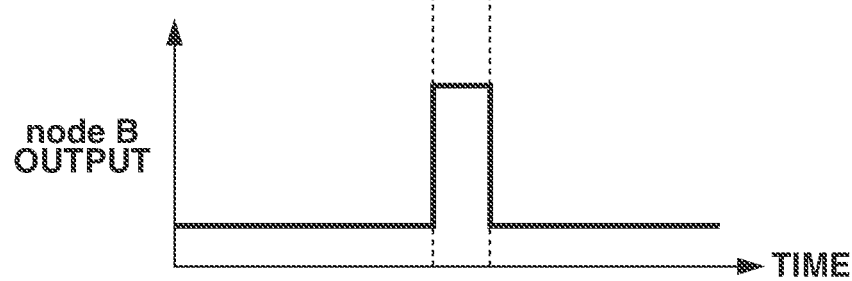

FIGS. 5A to 5C are diagrams schematically illustrating a relationship between the operation of the APD 201 and the output signal.

FIG. 5A is an excerpt illustrating the APD 201, the quenching element 202, and the waveform shaping unit 210 of FIG. 4. Here, the input node of the waveform shaping unit 210 will be referred to as node A, and the output node as node B. FIG. 5B illustrates a change in the waveform of node A in FIG. 5A, and FIG. 5C illustrates a change in the waveform of node B in FIG. 5A.

Between times t0 and t1, a potential difference of VH-VL is applied to the APD 201 of FIG. 5A. At time t1, a photon is incident on the APD 201. The APD 201 causes avalanche multiplication, and an avalanche multiplication current flows through the quenching element 202 and the voltage of node A drops. The amount of voltage drop increases further to reduce the potential difference applied to the APD 201, and at time t2, the avalanche multiplication by the APD 201 stops and the voltage level of node A stops dropping beyond a certain value. Subsequently, between times t2 and t3, a current to compensate the voltage drop from the voltage VL flows through node A. At time t3, node A settles at the original potential level. The portion of the output waveform of node A falling below a certain threshold is shaped by the waveform shaping unit 210 and output to node B as a signal.

The layout of the signal lines 113 and the layout of the column circuit 112 and the output circuit 114 are not limited to those of FIG. 3. For example, the signal lines 113 may be disposed to extend in a row direction, and the column circuit 112 may be located at the end of the signal lines 113.

Photoelectric conversion apparatuses according to respective exemplary embodiments will be described below.

A photoelectric conversion apparatus according to a first exemplary embodiment will be described with reference to FIGS. 6 to 11.

Figure 6:
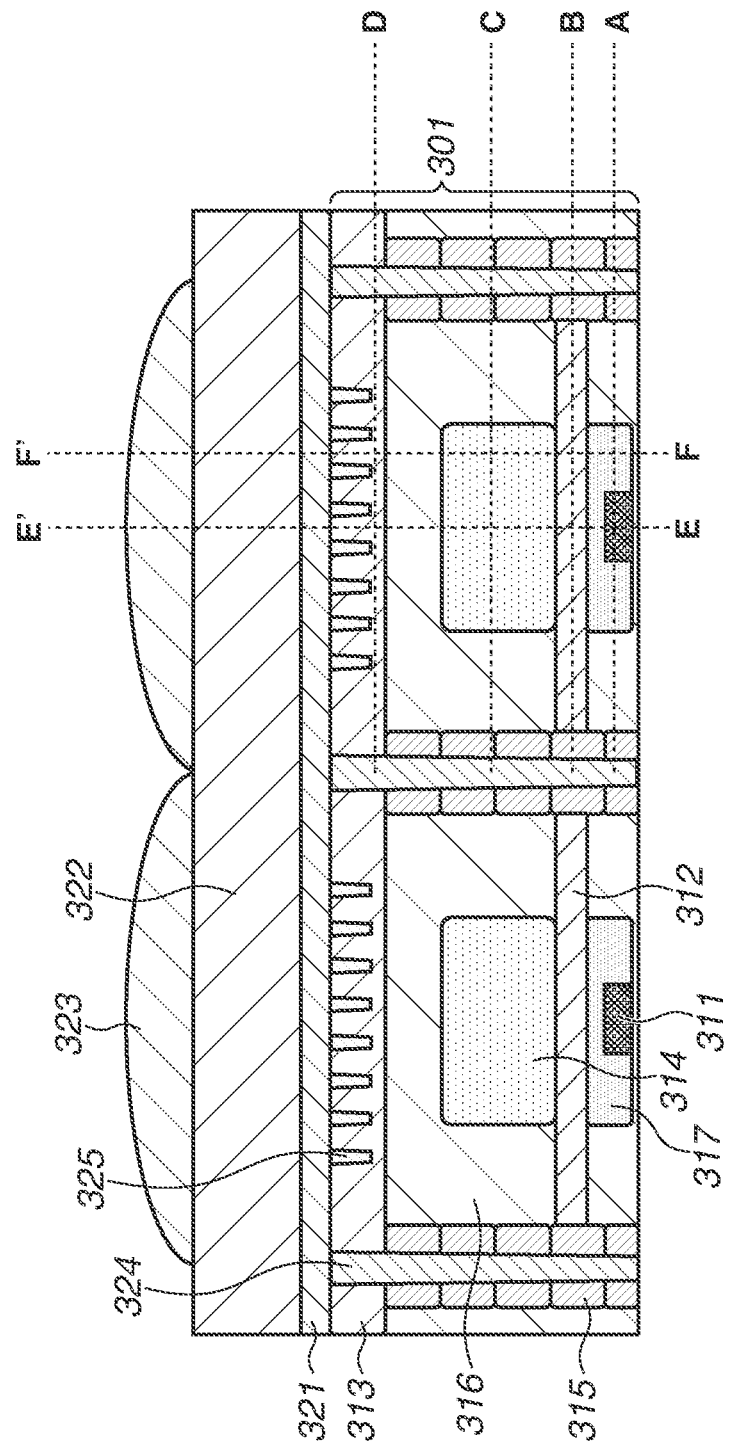
FIG. 6 is a sectional view of photoelectric conversion elements according to a first exemplary embodiment.

FIG. 6 is a sectional view of photoelectric conversion elements 102 in two pixels 101 of the photoelectric conversion apparatus according to the first exemplary embodiment, taken in a direction perpendicular to the substrate plane direction.

The structure and functions of the photoelectric conversion elements 102 will be described, Each photoelectric conversion element 102 includes an N-type first semiconductor region 311, fourth semiconductor region 314, sixth semiconductor region 316, and seventh semiconductor region 317. The photoelectric conversion element 102 further includes a P-type second semiconductor region 312, third semiconductor region 313, and fifth semiconductor region 315.

In the present exemplary embodiment, in the cross section illustrated in FIG. 6, the N-type first semiconductor region 311 is located near the surface opposite the light incident surface. The N-type seventh semiconductor region 317 is located around the first semiconductor region 311. The P-type second semiconductor region 312 is located to overlap the first and seventh semiconductor regions 311 and 317 in a plan view. The N-type fourth semiconductor region 314 is further located to overlap the second semiconductor region 312 in a plan view. The N-type sixth semiconductor region 316 is located around the fourth semiconductor region 314.

The first semiconductor region 311 has a higher N-type impurity concentration than those of the fourth and seventh semiconductor regions 314 and 317. The P-type second semiconductor region 312 and the N-type first semiconductor region 311 form a PN junction therebetween. The second semiconductor region 312 has a lower impurity concentration than that of the first semiconductor region 311, whereby the entire second semiconductor region 312 constitutes a depletion layer region. The depletion layer region further extends into part of the first semiconductor region 311, and a high electric field is induced in the extended depletion layer region. The high electric field causes avalanche multiplication in the depletion layer region extending into part of the first semiconductor region 311, and a current that is based on the amplified charges is output as a signal charge. The light incident on the photoelectric conversion element 102 is photoelectrically converted to cause avalanche multiplication in the depletion layer region (avalanche multiplication region), and generated charges of first conductivity type are collected to the first semiconductor region 311.

In FIG. 6, the fourth and seventh semiconductor regions 314 and 317 have substantially the same sizes. However, the sizes of the semiconductor regions are not limited thereto. For example, the fourth semiconductor region 314 may be formed greater than the seventh semiconductor region 317 to collect charges to the first semiconductor region 311 from a wider area.

A patterned structure 325 made of trenches is formed in the surface of the semiconductor layer 301 at the light incident surface side. The patterned structure 325 is surrounded by the P-type third semiconductor region 313, and scatters the light incident on the photoelectric conversion element 102, Since the incident light travels obliquely through the photoelectric conversion element 102, an optical path length greater than or equal to the thickness of the semiconductor layer 301 can be provided. This enables photoelectric conversion of light of longer wavelengths than without the patterned structure 325. This also provides the effect of improving the photoelectric conversion efficiency of the incident light since the patterned structure 325 prevents reflection of the incident light inside the substrate.

The fourth semiconductor region 314 and the patterned structure 325 are located to overlap in a plan view. The area of the portion of the fourth semiconductor region 314 overlapping the patterned structure 325 in a plan view is greater than that of the portion of the fourth semiconductor region 314 not overlapping the patterned structure 325. A charge occurring at a position far from the avalanche multiplication region formed between the first and fourth semiconductor regions 311 and 314 takes a long travel time to reach the avalanche multiplication region compared to a charge occurring at a position near the avalanche multiplication region. This can deteriorate timing jitter. Locating the fourth semiconductor region 314 and the patterned structure 325 to overlap in a plan view can increase the electric field in the deep parts of the photodiode, and reduce the collection time of charges occurring at positions far from the avalanche multiplication region. The timing jitter can thereby be reduced.

The third semiconductor region 313 three-dimensionally covers the patterned structure 325, whereby the occurrence of thermally excited charges at the interface of the patterned structure 325 can be reduced. This can lower the dark count rate (DCR) of the photoelectric conversion element 102.

The pixels 101 are isolated by trenched pixel isolation portions 324. The P-type fifth semiconductor regions 315 located around the pixel isolation portions 324 isolate the adjoining photoelectric conversion elements 102 from each other with a potential barrier. Since the photoelectric conversion elements 102 are also isolated by the potential of the fifth semiconductor regions 315, the trenched pixel isolation portions 324 are not necessarily needed. The pixel isolation portions 324, if provided, are not limited to the configuration of FIG. 6 in depth or position. The pixel isolation portions 324 may be a deep trench isolation (DTI) running through the semiconductor layer 301 or a DTI not running through the semiconductor layer 301. Metal may be embedded in the DTI to improve light shielding performance. The pixel isolation portions 324 may be configured to entirely surround the photoelectric conversion elements 102 in a plan view. The pixel isolation portions 324 may be located between the opposed sides of the photoelectric conversion elements 102.

The distance from one pixel isolation portion 324 to the pixel isolation portion 324 of an adjoining pixel 101 or a pixel 101 located at the nearest position can be regarded as the size of one photoelectric conversion element 102. With the size of one photoelectric conversion element 102 as L, a distance d from the light incident surface to the avalanche multiplication region satisfies $L\sqrt{2}/4 < d < L \times \sqrt{2}$. If the size and depth of the photoelectric conversion element 102 satisfy the equation, the strength of the electric field in the depth direction and the strength of the electric field in planar directions near the first semiconductor region 311 are substantially the same. This reduces variations in the time taken to collect charges, and can thus reduce the occurrence of timing jitter.

A pinning film 321, a planarization film 322, and microlenses 323 are further formed on the light incident surface side of the semiconductor layer 301. A not-illustrated filter layer may be further disposed on the light incident surface side. Various optical filters such as a color filter, an infrared cutoff filter, and a monochrome filter can be used for the filter layer. Examples of the color filter may include a red-green-blue (RUB) filter and a red-green-blue-white (RGBW) filter.

Figure 7:
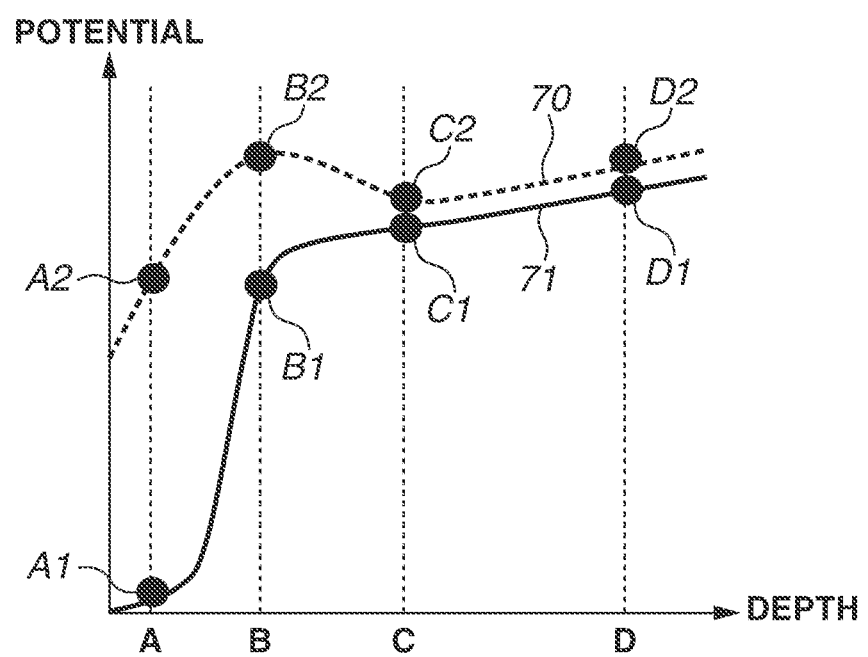
FIG. 7 is a potential map of a photoelectric conversion element according to the first exemplary embodiment.

FIG. 7 is a potential map of a photoelectric conversion element 102 illustrated in FIG. 6.

A dotted line 70 in FIG. 7 indicates the potential distribution along the segment FF' of FIG. 6. A solid line 71 in FIG. 7 indicates the potential distribution along the segment EE' of FIG. 6, FIG. 7 illustrates potentials with respect to an electron that is the majority carrier charge in N-type semiconductor regions, if the majority carrier charge is a hole, the relationship between the higher and lower potentials is reversed. Depth A in FIG. 7 corresponds to height A in FIG. 6. Similarly, depths B, C, and D correspond to heights B, C, and D, respectively.

In FIG. 7, the potential level of the solid line 71 at depth A will be denoted by A1, the potential level of the dotted line 70 at depth A by A2, the potential level of the solid line 71 at depth B by B1, and the potential level of the dotted line 70 at depth B by B2. The potential level of the solid line 71 at depth C will be denoted by C1, the potential level of the dotted line 70 at depth C by C2, the potential level of the solid line 71 at depth D by D1, and the potential level of the dotted line 70 at depth D by D2.

From FIGS. 6 and 7, it can be seen that the potential level of the first semiconductor region 311 corresponds to A1. The potential level near the center of the second semiconductor region 312 corresponds to B1. The potential level of the seventh semiconductor region 317 corresponds to A2. The potential level at the outer edge of the second semiconductor region 312 corresponds to B2.

The potential indicated by the dotted line 70 of FIG. 7 decreases gradually from depth D to depth C. The potential then increases gradually from depth C to depth B, and reaches the potential level B2 at depth B, The potential falls from depth B to depth A, and reaches the potential level A2 at depth A.

Meanwhile, the potential indicated by the solid line 71 decreases gradually from depth D to depth C and from depth C to depth B, and reaches the potential level B1 at depth B. The potential then drops sharply from depth B to depth A, and reaches the potential level A1 at depth A. At depth D, the potentials of the dotted line 70 and the solid line 71 are at substantially the same levels. In the areas indicated by the segments EE' and FF', the potentials have a gently falling gradient toward the second surface side of the semiconductor layer 301, Charges occurring in the photoelectric conversion element 102 thus move down the gentle potential gradient toward the second surface.

In the APD 201 according to the present exemplary embodiment, the P-type second semiconductor region 312 has a lower impurity concentration than that of the N-type first semiconductor region 311. Moreover, the first and second semiconductor regions 311 and 312 are supplied with respective reverse biasing potentials. This forms a depletion layer region in the second semiconductor region 312. With such a structure, the second semiconductor region 312 serves as a potential barrier against charges photoelectrically converted in the fourth semi conductor layer 314, facilitating charge collection to the first semiconductor region 311.

In FIG. 6, the second semiconductor region 312 is disposed throughout the photoelectric conversion element 102. However, the photoelectric conversion element 102 may be configured so that the second semiconductor region 312 is not disposed in a portion overlapping the first semiconductor region 311 in a plan view, and a slit in which the fourth semiconductor region 314 extends is disposed there, for example. In such a case, a potential difference between the second semiconductor region 312 and the slit portion causes the potential at depth C of FIG. 6 to decrease from the segment FF' toward the segment EE'. This facilitates the movement of charges toward the first semiconductor region 311 in the process where the charges photoelectrically converted in the fourth semiconductor region 314 move. On the other hand, if the second semiconductor region 312 is disposed throughout the photoelectric conversion element 102 as in FIG. 6, the voltage applied to obtain a high electric field for avalanche multiplication can be lowered to reduce noise due to the formation of a locally high electric field region as compared to the case where the slit is formed.

The charges moved to near the second semiconductor region 312 are accelerated for avalanche multiplication by the steep potential gradient of the solid line 71 of FIG. 7 from depth B to depth A, i.e., by a high electric field.

By contrast, the potential distribution between the N-type seventh semiconductor region 317 and the P-type second semiconductor region 312 in FIG. 6, i.e., the dotted line 70 in FIG. 7 from depth B to depth A does not cause avalanche multiplication. The charges occurring in the fourth semiconductor region 314 can thus be counted as signal charges without increasing the area of the high electric field region (avalanche multiplication region) with respect to the size of the APD 201. While the conductivity type of the seventh semiconductor region 317 has been described to be N type so far, the seventh semiconductor region 317 may be a P-type semiconductor region as long as its impurity concentration satisfies the foregoing potential relationship.

Charges photoelectrically converted in the second semiconductor region 312 flow into the fourth semiconductor region 314 due to the potential gradient of the dotted line 70 of FIG. 7 from depth B to depth C. For the reason described above, the charges in the fourth semiconductor region 314 move easily to the second semiconductor region 312. The charges photoelectrically converted in the second semiconductor region 312 therefore move to the first semiconductor region 311 and are detected as a signal charge through avalanche multiplication. The photoelectric conversion element 102 thus has sensitivity to the charges photoelectrically converted in the second semiconductor region 312.

The dotted line 70 of FIG. 7 indicates the sectional potential along the segment FF' of FIG. 6. On the dotted line 70, A2 corresponds to the point where height A and the segment FF' intersect in FIG. 6, B2 the point where height B and the segment FF' intersect, C2 the point where height C and the segment FF' intersect, and D2 the point where height D and the segment FF' intersect. Electrons photoelectrically converted in the fourth semiconductor region 314 of FIG. 6 move along the potential gradient from D2 to C2 of FIG. 7, but are difficult to move from C2 to B2 since the second semiconductor region 312 serves as a potential barrier to the electrons. The electrons thus move to near the center of the fourth semiconductor region 314 indicated by the segment EE' in FIG. 6. The moved electros move along the potential gradient from C1 to B1 of FIG. 7, avalanche-multiplied along the steep potential gradient from B1 to A1, and passed through the first semiconductor region 311 and then detected as a signal charge.

Charges occurring near the border between the third and sixth semiconductor regions 313 and 316 of FIG. 6 move along the potential gradient from D2 to C2 of FIG. 7. As described above, the charges then move to near the center of the fourth semiconductor region 314 indicated by the segment EE' in FIG. 6. The charges are then avalanche-multiplied along the steep potential gradient from B1 to A1. The avalanche-multiplied charges are passed through the first semiconductor region 311 and then detected as a signal charge.

Figure 8:
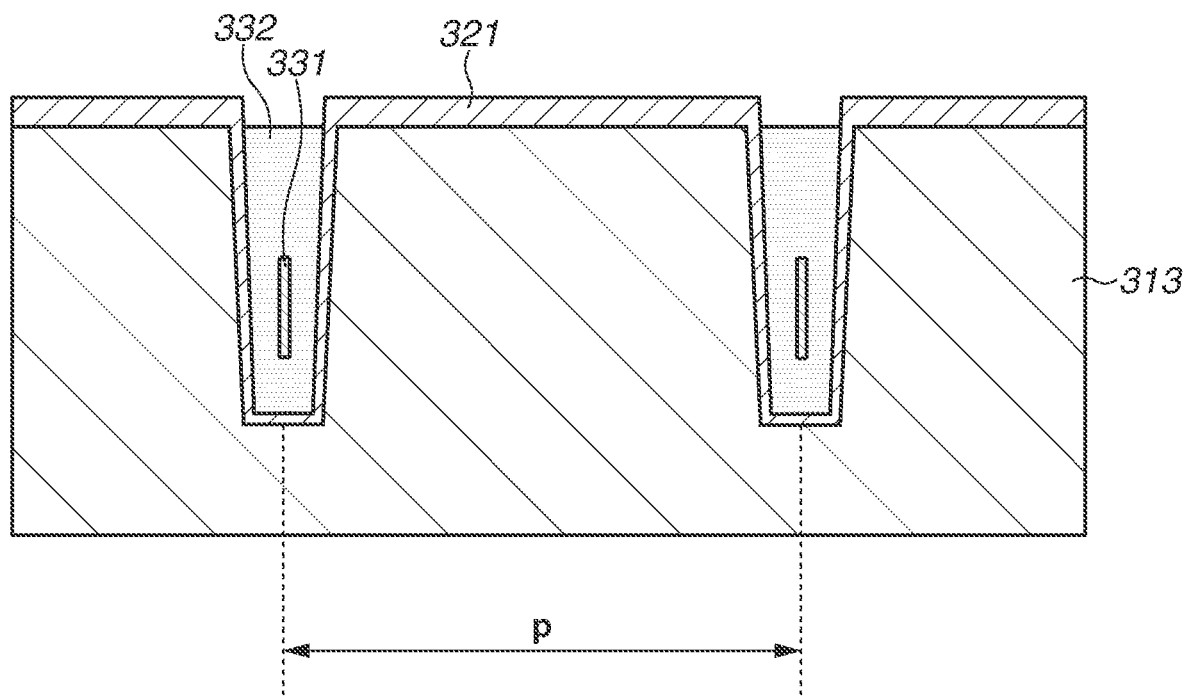
FIG. 8 is a sectional view of a trench structure of the photoelectric conversion element according to the first exemplary embodiment.

FIG. 8 is an enlarged sectional view of two of the trenches constituting the patterned structure 325 of the photoelectric conversion apparatus 100 according to the first exemplary embodiment.

The trench structure is formed of materials different from that of the third semiconductor region 313. For example, if the third semiconductor region 313 is formed of silicon, the main members constituting the trench structure are formed of a silicon oxide film or silicon nitride film. Metal or organic materials may be included. The trenches are formed in a depth of 0.1 to 0.6 μm from the surface of the semiconductor layer 301, for example. To sufficiently enhance the diffraction of the incident light, in one embodiment, the trench depth is greater than the trench width. As employed herein, the trench width refers to the width from an interface of the pinning film 321 and the third semiconductor region 313 to another interface of the pinning film 321 and the third semiconductor region 313 on the plane passing through the center of gravity of the cross section of the trench. The trench depth refers to the depth from the light incident surface to the trench bottom.

A period p illustrated by the arrow in FIG. 8 represents one period of the patterned structure 325 including a plurality of trenches. The period of the patterned structure 325 refers to the distance from the center of gravity of a trench in the patterned structure 325 to the center of gravity of another trench adjoining the trench in the sectional view. An average of the pattern periods of the entire patterned structure 325 is referred to as an effective period.

The process for forming the trenches will be described. Initially, grooves (trenches) are formed in the third semiconductor region 313 of the semiconductor layer 301 by etching. The pinning film 321 is then formed on the surface of the third semiconductor region 313 and inside the trenches by a method such as chemical vapor deposition. The interior of the trenches covered with the pinning film 321 is filled with filler members 332. The trenches constituting the patterned structure 325 can be formed by the same process as the process for forming the trenches constituting the pixel isolation portions 324. In such a case, the side surface portions of the trenches constituting the patterned structure 325 and those of the trenches constituting the pixel isolation portions 324 have the same impurity concentration.

The filler members 332 may have voids 331 inside. Since the voids 331 have a refractive index lower than that of the filler members 332, light passed through the voids 331 and light passed through other portions have an optical path difference. This increases differences in the refractive index of the entire patterned structure 325 and increases phase differences in the light transmitted through the patterned structure 325 as compared to without void in the filler members 332, whereby the diffraction of the incident light can be enhanced more easily. In other words, the formation of the voids 331 in the filler members 332 provides the effect of enhancing the intensity of the incident light in a specific phase and improving sensitivity.

Figure 9A:
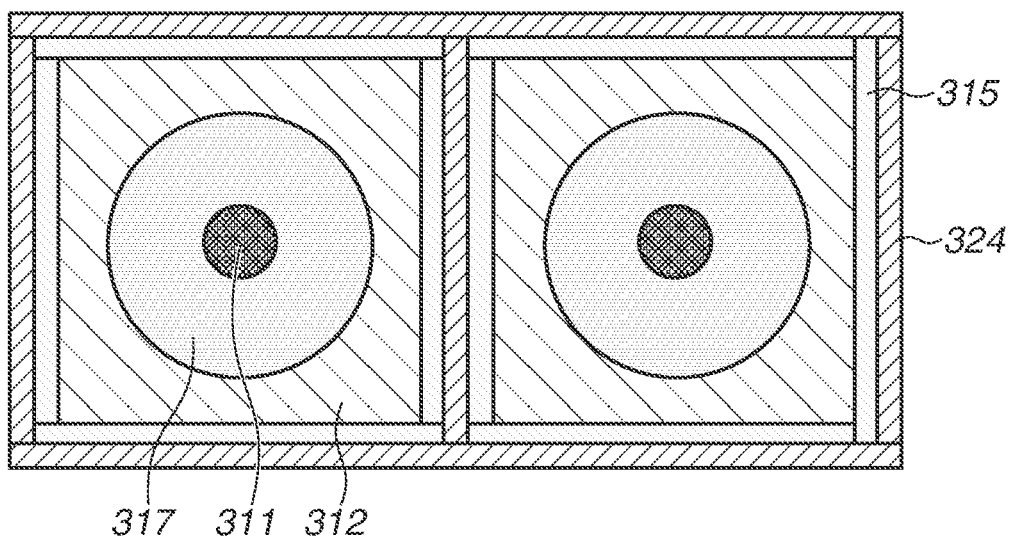
FIGS. 9A and 9B are plan views of the photoelectric conversion elements according to the first exemplary embodiment.
Figure 9B:
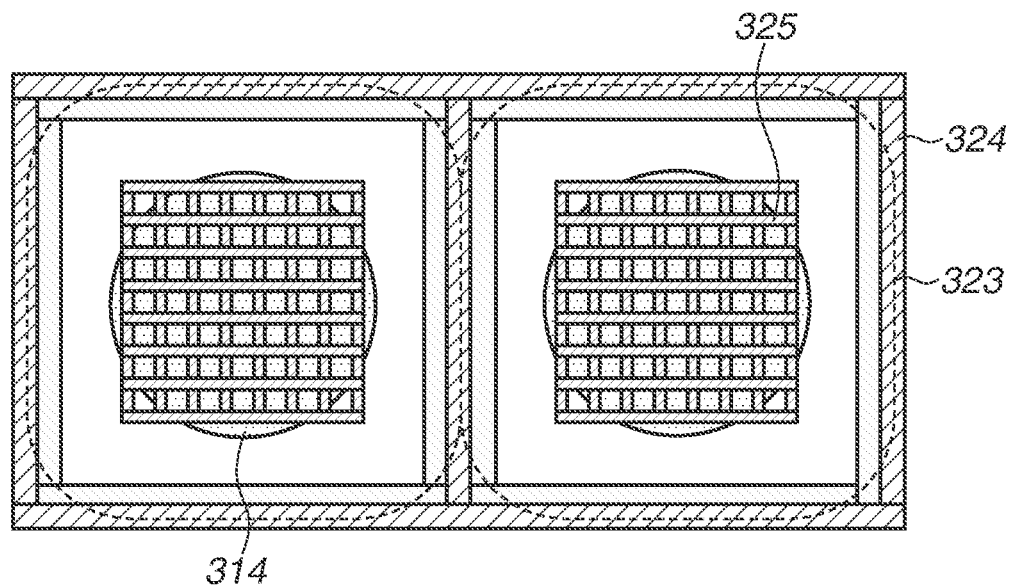

FIGS. 9A and 9B are plan views of two pixels of the photoelectric conversion apparatus 100 according to the first exemplary embodiment. FIG. 9A is a plan view from the side opposite the light incident surface side. FIG. 9B is a plan view from the light incident surface side.

In FIG. 9A, the first, fourth, and seventh semiconductor regions 311, 314, and 317 are circular in shape and concentrically arranged. Such a structure provides the effect of reducing a local electric field concentration at the ends of the high electric field region between the first and second semiconductor regions 311 and 312 and reducing the DCR. The shapes of the semiconductor regions 311, 314, and 317 are not limited to the circular shapes, and may have polygonal shapes with the same barycentric positions, for example.

In FIG. 9B, the patterned structures 325 are formed in a grid shape in a plan view. The patterned structures 325 are located to overlap the first and fourth semiconductor regions 311 and 314. The barycentric positions of the patterned structures 325 are included in the avalanche multiplication regions in a plan view, in such grid-shaped trench structures illustrated in FIG. 9B, the intersections of the trenches have a greater trench depth than that of the singly-extending portions of the trenches. The trench bottoms at the intersections of the trenches are located closer to the light incident surface than the position corresponding to one half of the thickness of the semiconductor layer 301, As employed herein, the trench depth refers to the depth from the first surface to the bottom, and can be said to be the depth of the recesses of the patterned structures 325.

Figure 10:
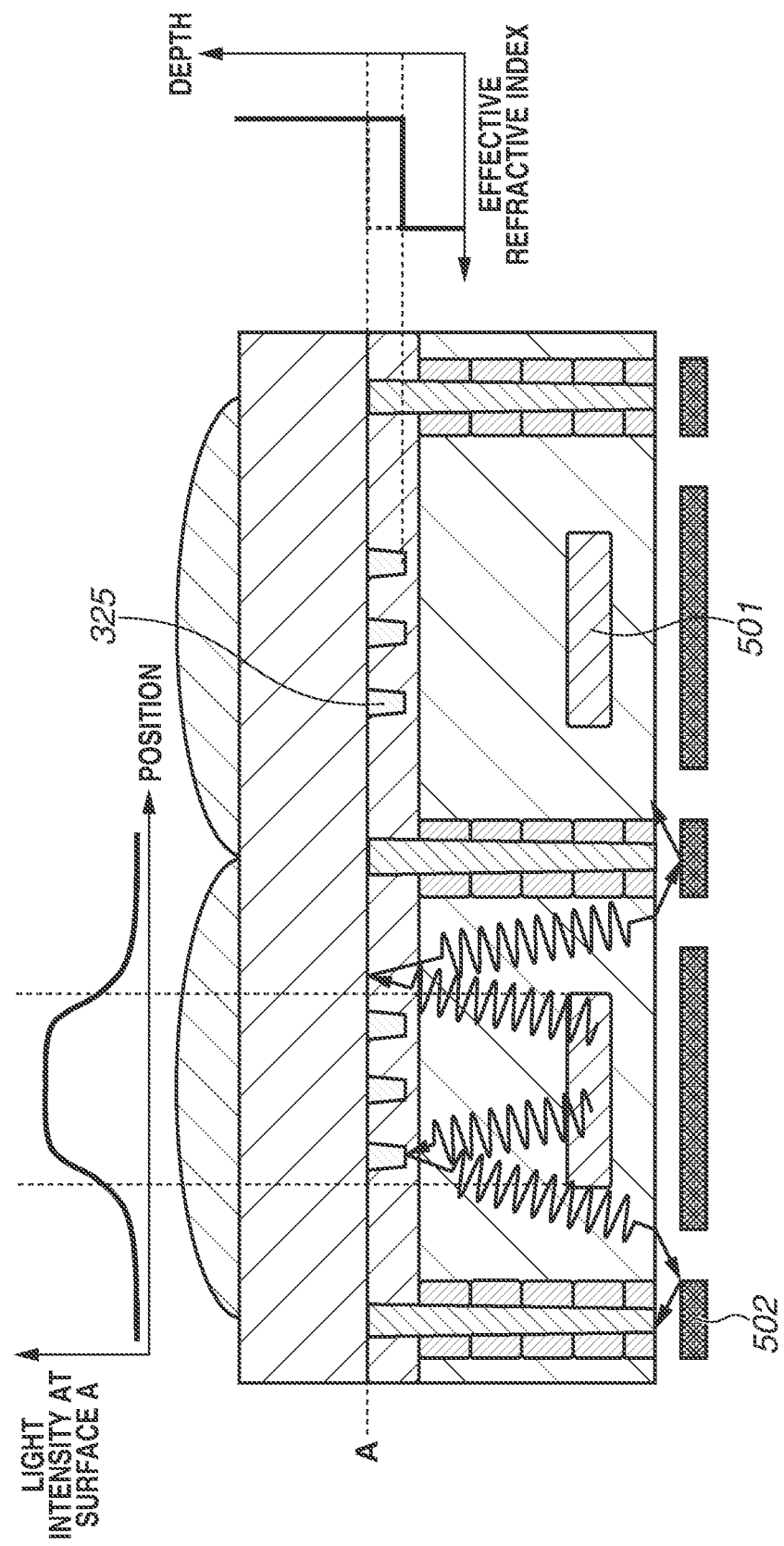
FIG. 10 illustrates a comparative example of the photoelectric conversion elements according to the first exemplary embodiment.

FIG. 10 illustrates a comparative example of the photoelectric conversion apparatus 100 according to the first exemplary embodiment. FIG. 10 illustrates the photoelectric conversion apparatus 100 in a simplified form. The photoelectric conversion apparatus 100 includes avalanche multiplication regions 501, a wiring layer 502, and patterned structures 325.

If light is incident on such a photoelectric conversion apparatus 100, avalanche tight emission can occur in the avalanche multiplication regions 501, The avalanche light emission refers to a phenomenon where a large amount of electrons or holes generated by avalanche multiplication are recombined with charges of opposite polarity to generate photons. Leakage of the photons generated by the avalanche light emission into adjoining pixels causes a false signal and lowers the image quality.

The patterned structures 325 disposed on the light emission surface side of the semiconductor layer of the photoelectric conversion apparatus 100 illustrated in FIG. 10 have an effective period longer than the wavelengths of the avalanche-emitted light. The avalanche-emitted light has a spectrum somewhat ranging from short to long wavelengths. Components having shorter wavelengths have shorter absorption lengths in the substrate and are photoelectrically converted at positions closer to the light-emitting regions. Such components are thus less likely to reach adjoining pixels and cause a false signal. By contrast, components having longer wavelengths have longer absorption lengths in the substrate and are more likely to cause a false signal at positions farther from the light-emitting regions. Such components are thus a dominant factor for the foregoing drop in image quality. The component having the longest wavelength in the spectrum of the avalanche-emitted light therefore can approximately be regarded as a typical factor for the drop in image quality. The maximum value of the wavelength of the avalanche-emitted light depends on the band gap of the substrate material, and is determined by $hc/E_a$ (h: Planck's constant [J·s], c: the speed of light [m/s], and $E_a$: the band gap of the substrate [J]). For example, if the sensor substrate is formed of silicon, the maximum value of the wavelength of the avalanche-emitted light is approximately 1.1 μm.

If the patterned structures 325 have an effective period longer than the wavelengths of the avalanche-emitted light, the avalanche-emitted light behaves as particles with respect to the patterned structures 325. Since the effective refractive index changes sharply with the substrate depth, the avalanche-emitted light is reflected by the bottoms of the patterned structures 325. The reflected light becomes stray light within the pixels.

FIG. 11 illustrates an example of the photoelectric conversion apparatus 100 according to the first exemplary embodiment. Like FIG. 10, FIG. 11 illustrates the photoelectric conversion apparatus 100 in a simplified form.

The patterned structures 325 disposed on the light incident surface side of the semiconductor layer 301 of the photoelectric conversion apparatus 100 illustrated in FIG. 11 have a period shorter than the wavelengths of the avalanche-emitted light. If the sensor substrate 11 is formed of silicon, the patterned structures 325 are formed with a period of 1.1 μm to 0.2 μm. If avalanche light emission occurs in such a photoelectric conversion apparatus 100, the avalanche-emitted light behaves as waves. Since the effective refractive index changes gently with the depth of the semiconductor layer 301, the avalanche-emitted light is less reflected by the bottoms of the patterned structures 325. The avalanche-emitted light entering the patterned structures 325 travels to outside the sensor substrate 11, whereby stray light within the pixels 101 is reduced. The effect of reducing stray light can be more efficiently obtained by disposing the patterned structures 325 in the centers of the photoelectric conversion elements 102 where the light intensity of the avalanche-emitted light at the light incident surface of the semiconductor layer 301 is high.

The trenches constituting the patterned structures 325 illustrated in FIG. 11 are tapered and do not have a constant width. Such patterned structures 325 can provide the effect of the present exemplary embodiment if the average width in a cross section tin FIG. 11, the width at one half of the trench depth) satisfies the condition that the period is shorter than the wavelengths of the avalanche-emitted light. In other words, the trench width satisfies $hc/2E_a$ (h: Planck's constant [J·s], c: the speed of light [m/s], and $E_a$: the band gap of the substrate [J]). For example, if the sensor substrate 11 is formed of silicon, the trench width is 0.55 μm or less. The effective period can be said to be shorter than the wavelength at which the light absorption length of the semiconductor substrate is the same as the distance from the light incident surface to the interface between the first and second semiconductor regions 311 and 312.

The wiring layer 502 includes Al wiring, and functions as a reflection member for reflecting the light transmitted through the semiconductor layer 301 back into the pixels 101.

In such a manner, crosstalk can be reduced by making the period of the patterned structures 325 disposed on the light incident surface side of the semiconductor layer 301 shorter than the wavelengths of the avalanche-emitted light.

A photoelectric conversion apparatus according to a second exemplary embodiment will be described with reference to FIGS. 12A and 12B.

A description of parts common with the first exemplary embodiment will be omitted, and difference from the first exemplary embodiment will mainly be described. In the present exemplary embodiment, patterned structures are formed to include T-shaped overlaps when seen in a plan view.

Figure 12A:
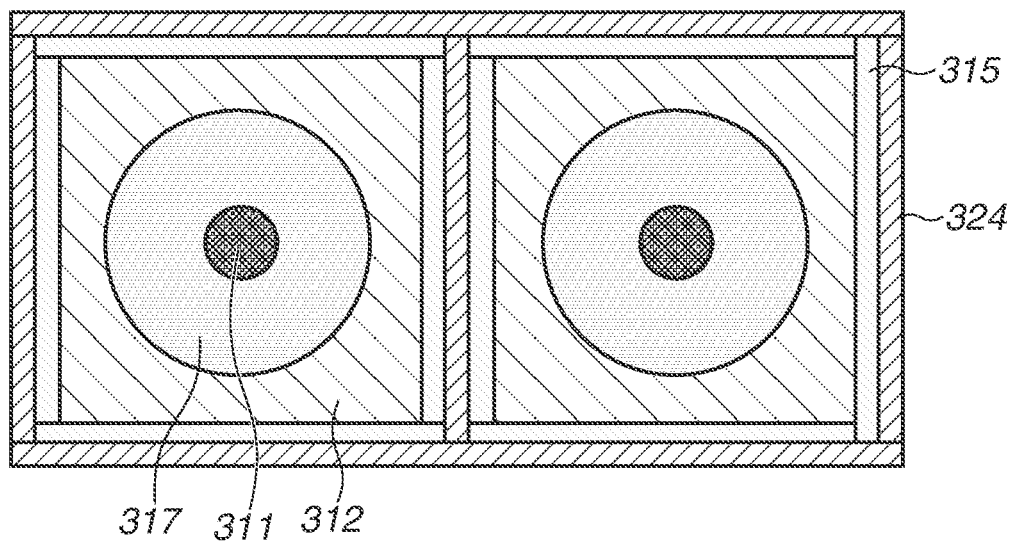
FIGS. 12A and 12B are plan views of photoelectric conversion elements according to a second exemplary embodiment.
Figure 12B:
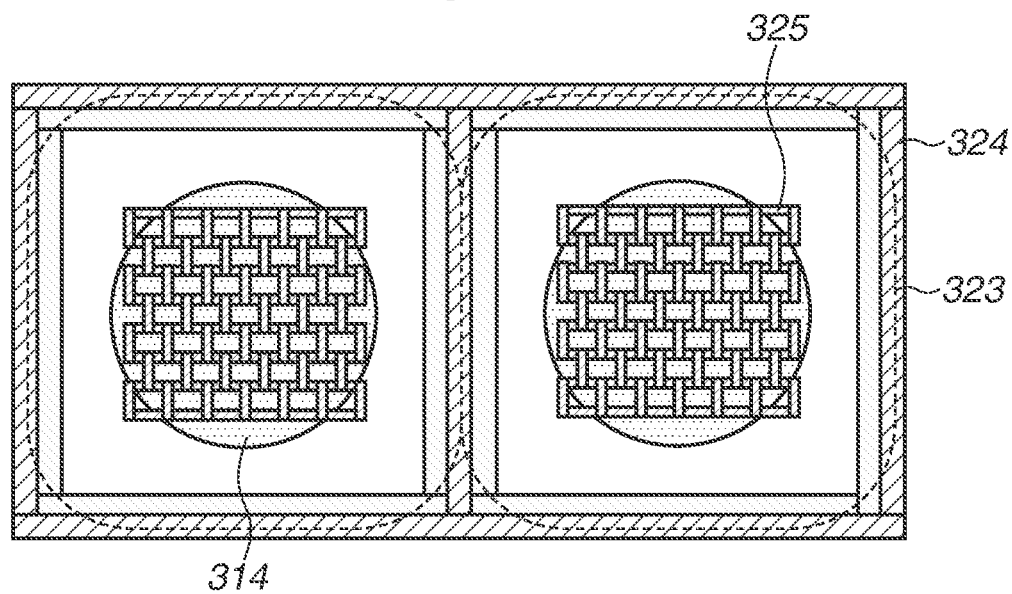

FIGS. 12A and 12B are plan views of two pixels of the photoelectric conversion apparatus according to the second exemplary embodiment.

In the plan view from the light incident surface side (FIG. 12B), the trenches constituting the patterned structures 325 are arranged so that a plurality of rectangles is juxtaposed by repeating T-shaped configurations. The patterned structures 325 can be said to be grid-shaped structures formed by shifting the d-shaped trench structures illustrated in FIG. 9B a one-half pitch row by row.

With such a configuration, the number of portions where the trenches overlap and are over-etched in the etching process for trench formation decreases as compared to the case where the patterned structures 325 form vertically and horizontally intersecting grids. This can reduce the possibility that the etching causes damages, such as a lattice defect, to the semiconductor layer and causes a dark current to deteriorate the DCR.

Modification of Second Exemplary Embodiment

Figure 13A:
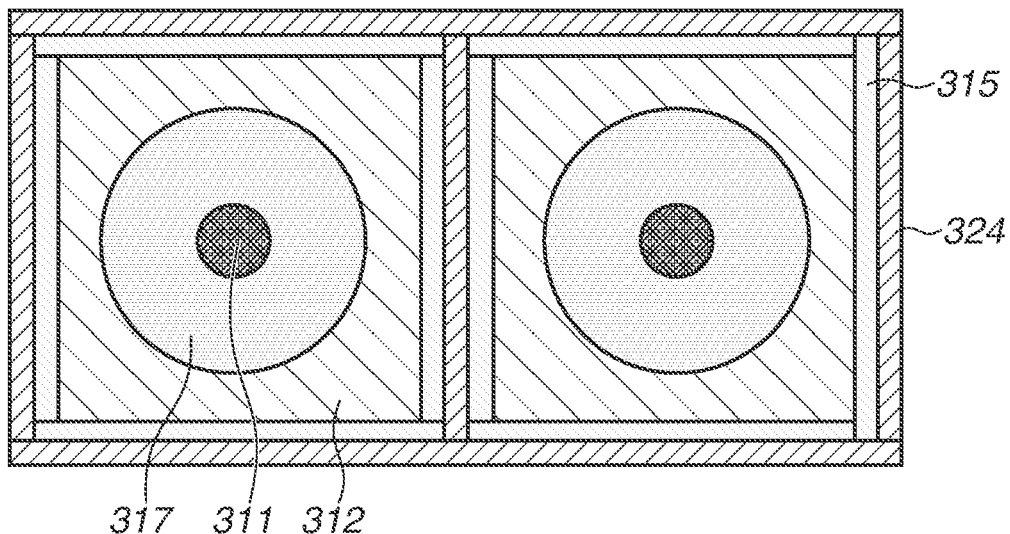
FIGS. 13A and 13B are plan views of photoelectric conversion elements according to a modification of the second exemplary embodiment.
Figure 13B:
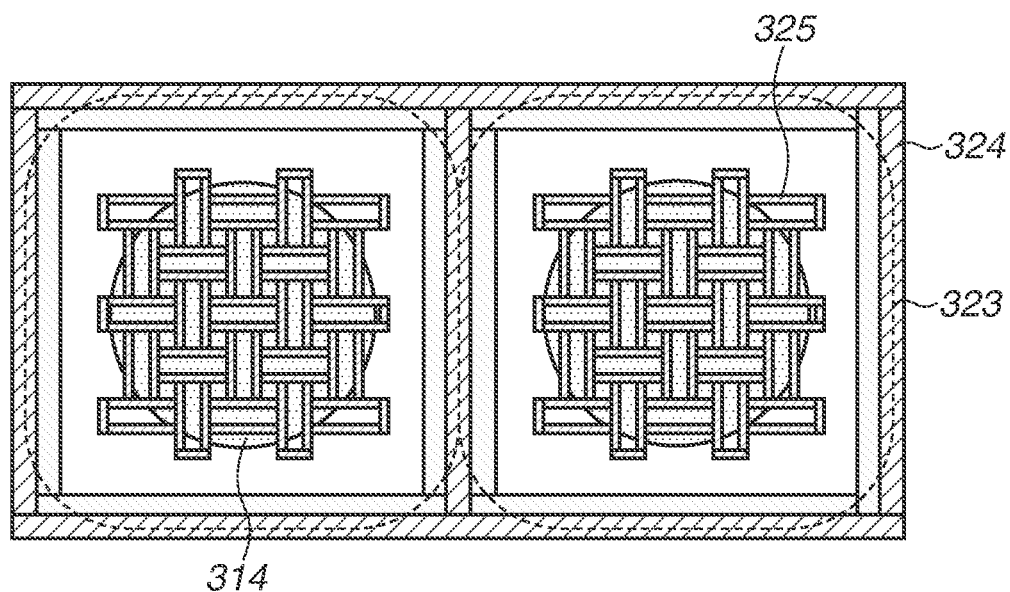

FIGS. 13A and 13B illustrate plan views of two pixels of a photoelectric conversion apparatus according to a modification of the second exemplary embodiment.

In the plan view from the light incident surface side (FIG. 13B), the trenches constituting the patterned structures 325 are arranged so that a plurality of rectangles having different areas is juxtaposed by repeating T-shaped configurations.

Even with such a configuration, the number of portions where the trenches overlap and are over-etched decreases as compared to the case where the patterned structures 325 form vertically and horizontally intersecting grids. This can reduce the possibility that the etching causes damages, such as a lattice defect, to the semiconductor layer and causes a dark current to deteriorate the DCR.

A photoelectric conversion apparatus according to a third exemplary embodiment will be described with reference to FIGS. 14 to 17.

Figure 14:
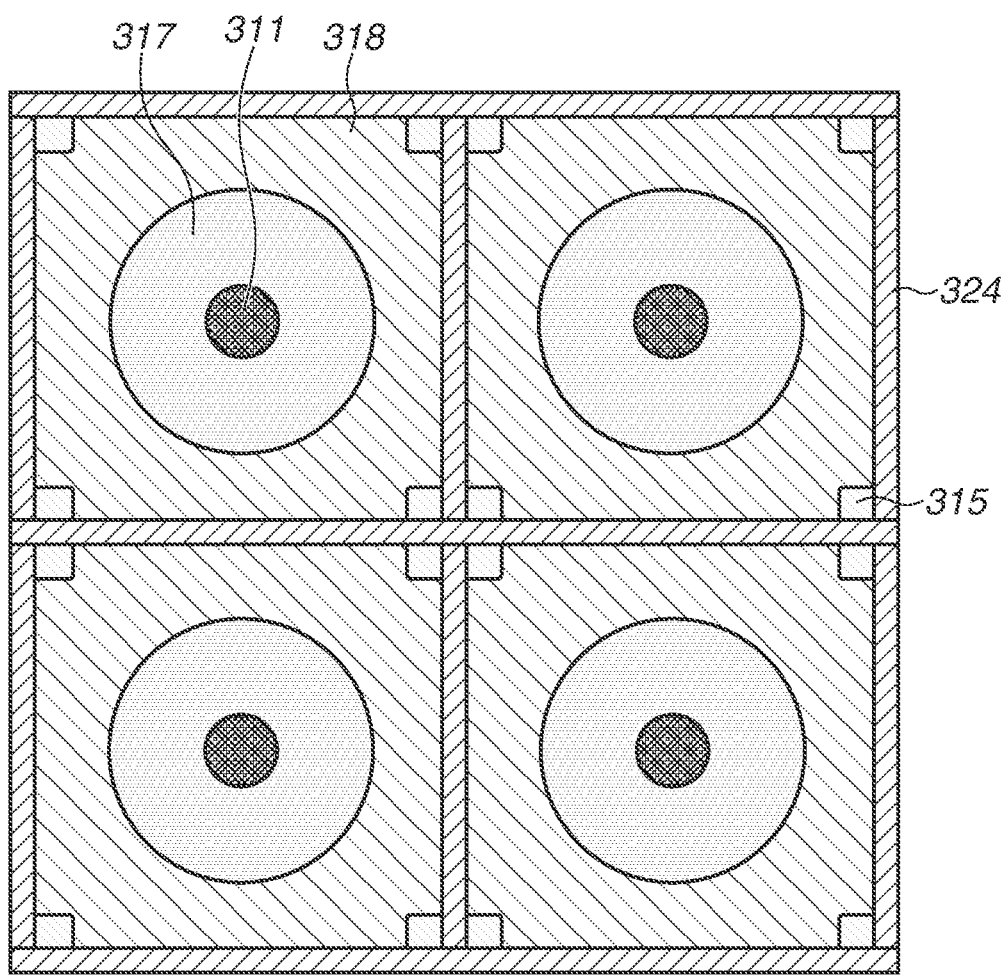
FIG. 14 is a plan view of a photoelectric conversion apparatus according to a third exemplary embodiment.

A description of parts common with the first and second exemplary embodiments will be omitted, and differences from the first exemplary embodiment will mainly be described, FIG. 14 is a plan view of four pixels of the photoelectric conversion apparatus according to the third exemplary embodiment, seen from a surface opposite the light incident surface. A difference from the photoelectric conversion apparatuses 100 according to the first and second exemplary embodiments is that N-type eighth semiconductor regions 318 are disposed around the seventh semiconductor regions 317. The eighth semiconductor regions 318 disposed on the surface opposite the light incident surface have an N-type impurity concentration lower than that of the first semiconductor regions 311.

Figure 15:
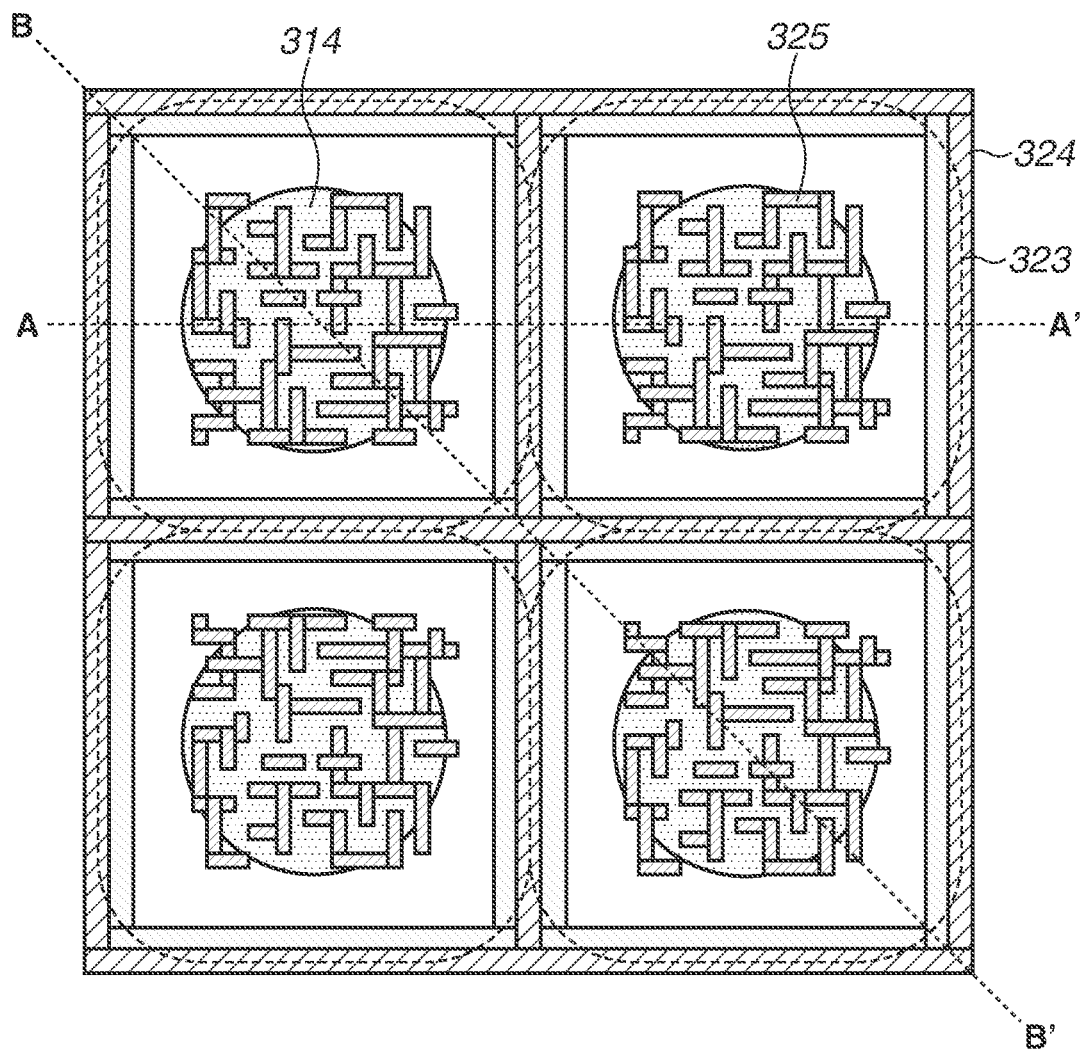
FIG. 15 is a plan view of photoelectric conversion elements according to the third exemplary embodiment.

FIG. 15 is a plan view of the four pixels of the photoelectric conversion apparatus according to the third exemplary embodiment from the light incident surface side.

In the plan view from the light incident surface side, the patterned structures 325 include non-periodic structures of randomly arranged trenches. Even in this case, the patterned structures 325 are configured to have an effective period shorter than the wavelengths of the avalanche-emitted light.

The random distributions of the trenches in the patterned structures 325 can uniformize the distribution of angles of diffracted light at which the incident light is diffracted by the patterned structures 325 to enhance the sensitivity improvement effect. The patterned structures 325 are not limited to such a layout, and may form a plurality of independent island-like structures within the surface, for example.

Figure 16:
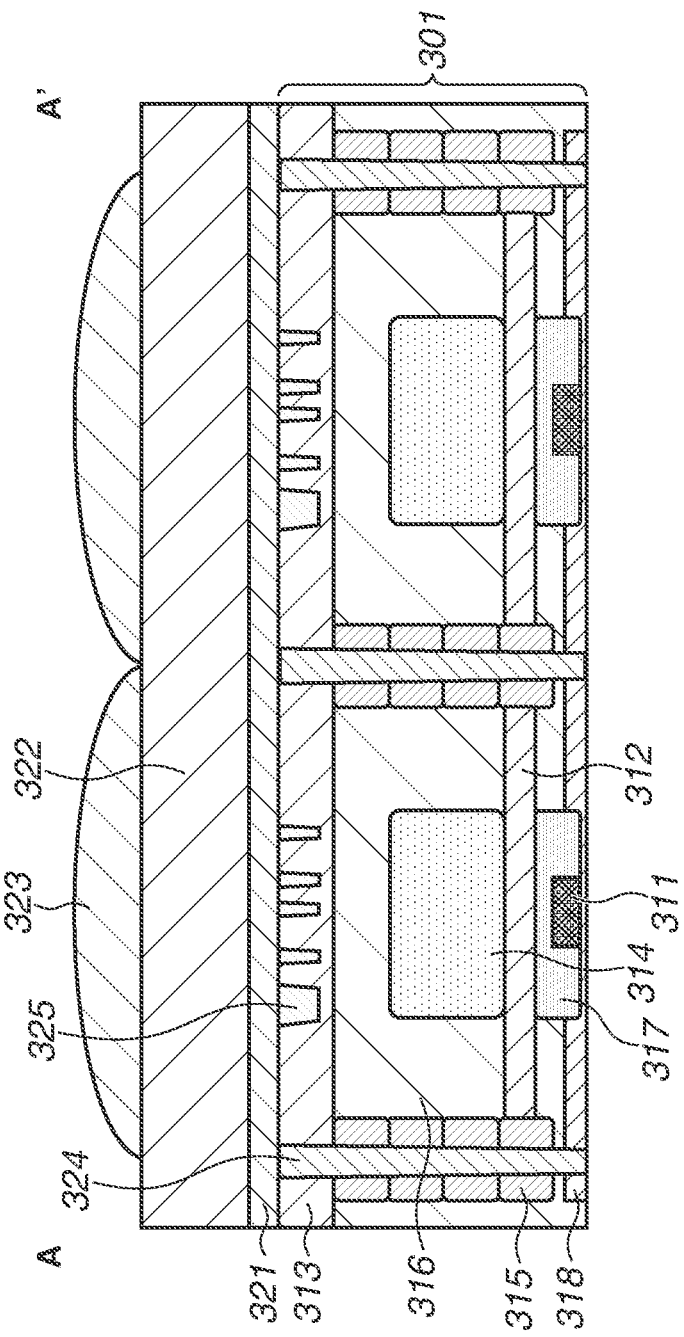
FIG. 16 is a sectional view of the photoelectric conversion elements according to the third exemplary embodiment.
Figure 17:
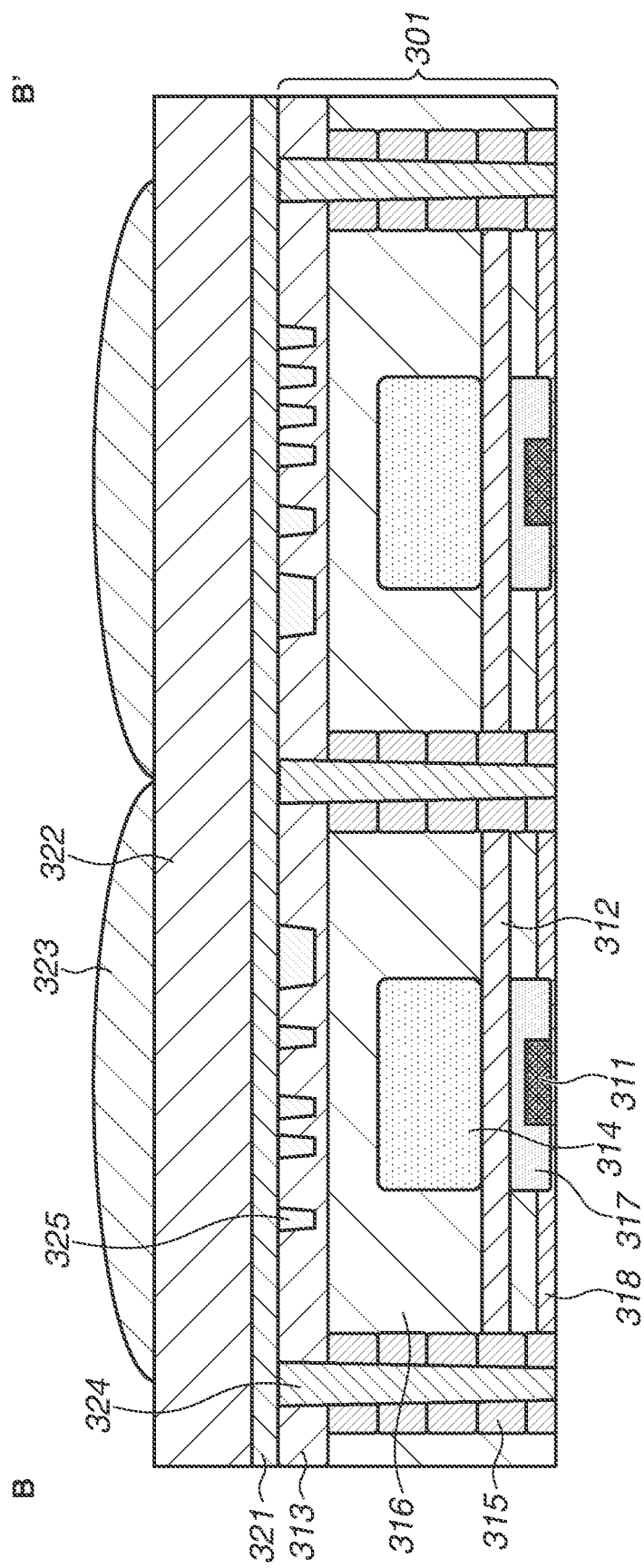
FIG. 17 is a sectional view of the photoelectric conversion elements according to the third exemplary embodiment.

FIG. 16 is a sectional view of the pixels of the photoelectric conversion apparatus according to the third exemplary embodiment, taken along the direction A-A' of FIG. 15, FIG. 17 is a sectional view of the pixels of the photoelectric conversion apparatus according to the third exemplary embodiment, taken along the direction B-B' of FIG. 15.

In the cross section along the direction A-A' (side-to-side direction of the pixels), the pixels according to the present exemplary embodiment do not include the fifth semiconductor regions 315 extending down to the surface opposite the light incident surface. The fifth semiconductor regions 315 and the eighth semiconductor regions 318 are separated from each other. By contrast, in the cross section along the direction B-B' (diagonal direction of the pixels), the fifth semiconductor regions 315 extend from the light incident surface side to the surface opposite the light incident surface.

Disposing not the fifth semiconductor regions 315 but the eighth semiconductor regions 318 at the pixel corners can ease the electric field in planar directions. This facilitates collecting dark charges occurring at the pixel corners to the first semiconductor regions 311 by a lateral electric field and discharging the dark charges without passing through the high electric field regions where avalanche multiplication is induced, Deterioration in the DCR is thereby reduced. The absence of the fifth semiconductor regions 315 at the pixel corners can also prevent concentration of the lateral electric field between the fifth semiconductor regions 315 and the first semiconductor regions 311, facilitating miniaturization of the pixels.

A photoelectric conversion apparatus according to a fourth exemplary embodiment will be described with reference to FIGS. 18 to 20.

A description of parts common with the first to third exemplary embodiments will be omitted, and differences from the first exemplary embodiment will mainly be described.

Figure 18:
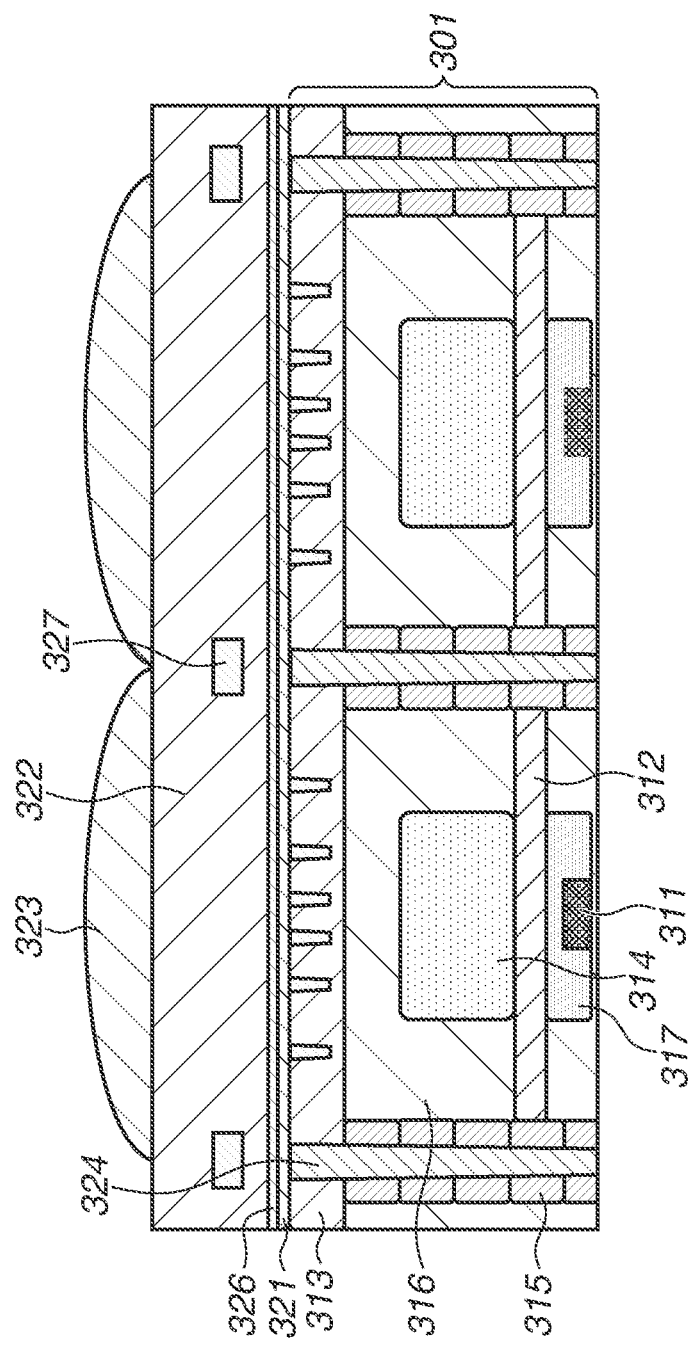
FIG. 18 is a sectional view of photoelectric conversion elements according to a fourth exemplary embodiment.
Figure 19A:
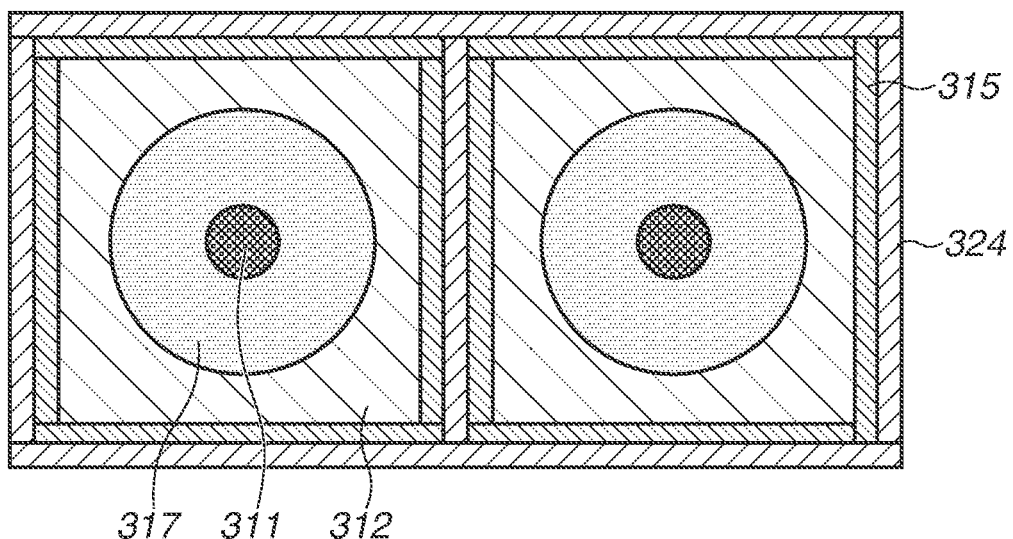
FIGS. 19A and 19B are plan views of the photoelectric conversion elements according to the fourth exemplary embodiment.
Figure 19B:
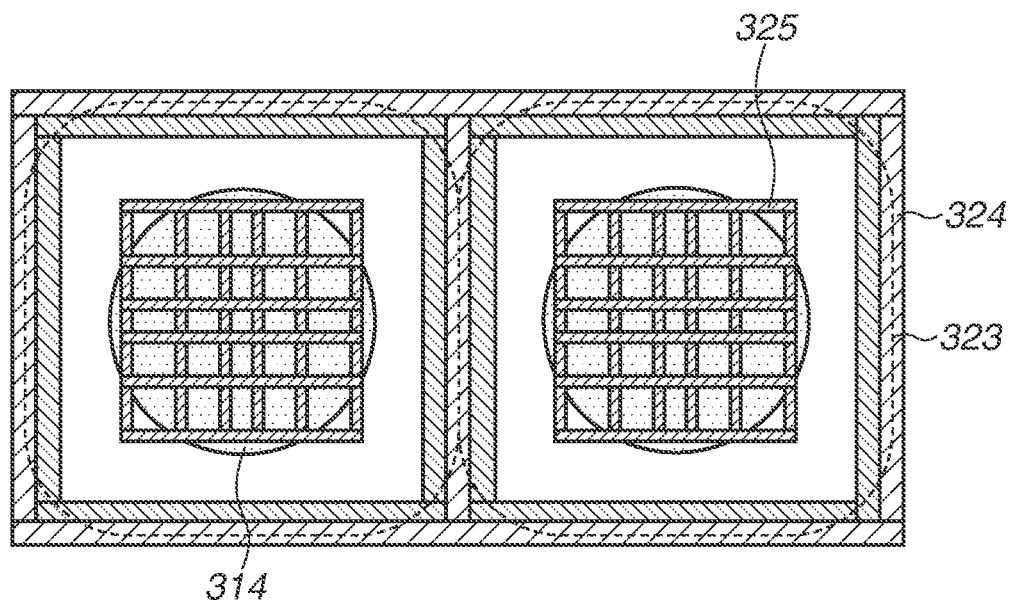
Figure 20:
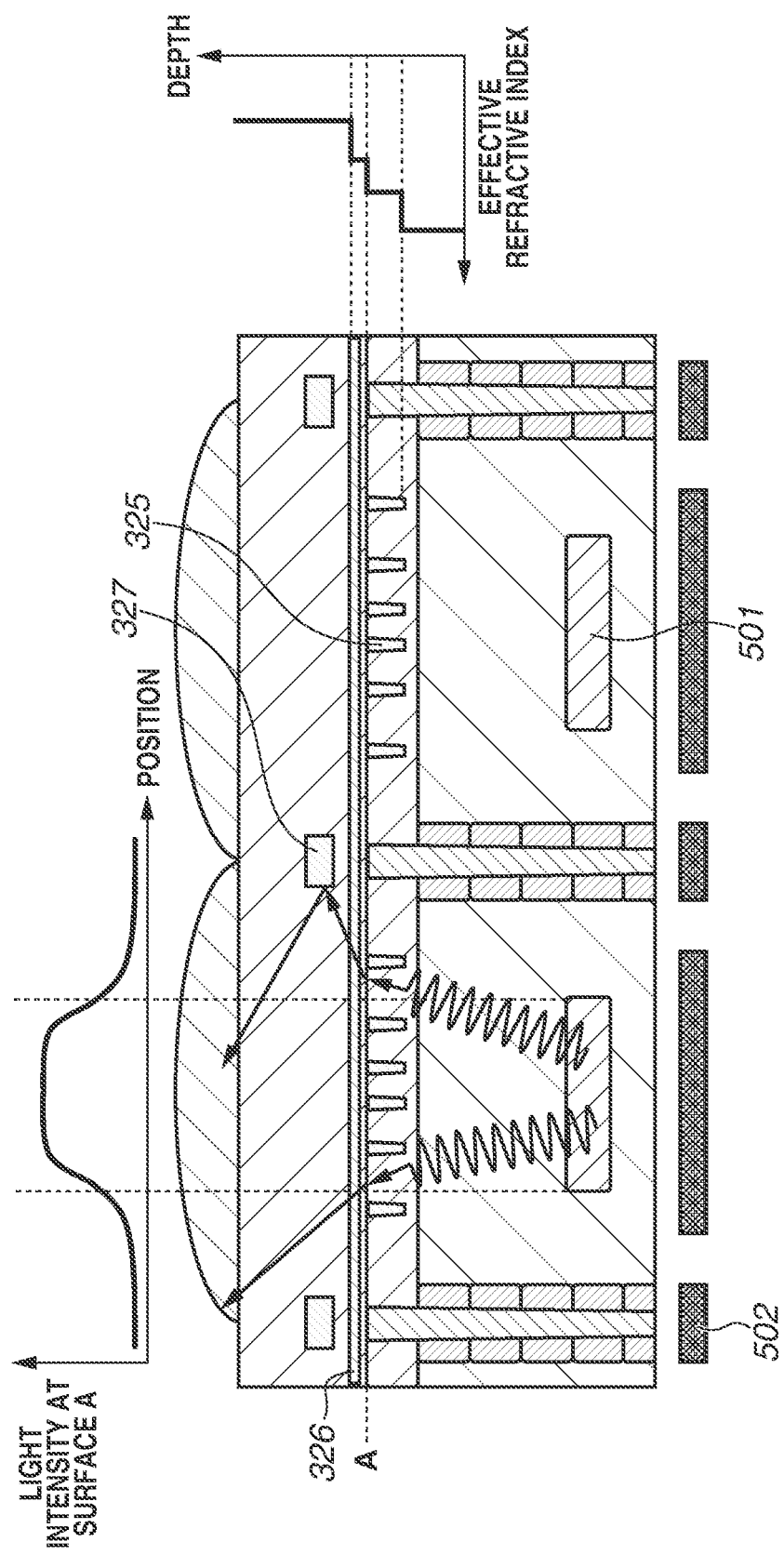
FIG. 20 illustrates a comparative example of the photoelectric conversion elements according to the fourth exemplary embodiment.

FIG. 18 is a sectional view of two pixels of a photoelectric conversion apparatus 100 according to the fourth exemplary embodiment, FIGS. 19A and 19B are plan views of the two pixels of the photoelectric conversion apparatus 100 according to the fourth exemplary embodiment. FIG. 19A is a plan view from the surface opposite the light incident surface. FIG. 19B is a plan view from the light incident surface side.

As illustrated in FIGS. 18, 19A, and 19B, the photoelectric conversion apparatus 100 according to the present exemplary embodiment includes an antireflection film 326 between the semiconductor layer 301 and the interlayer film (planarization film) 322. Differences from the first to third exemplary embodiments include that light shielding portions 32 are disposed between the pixels and that the patterned structures 325 are formed with a density distribution not uniform within the respective pixels.

The effect of the fourth exemplary embodiment will be described with reference to FIG. 20 that is a comparative diagram illustrating two pixels of the photoelectric conversion apparatus 100 according to the fourth exemplary embodiment. FIG. 20 illustrates the photoelectric conversion apparatus 100 in a simplified form. The photoelectric conversion apparatus 100 is a photoelectric conversion apparatus including the avalanche multiplication regions 501, the wiring layer 502, the patterned structures 325, the antireflection film 326, and the light shielding portions 327.

The antireflection film 326 has a refractive index lower than the effective refractive index of the patterned structures 325. As employed herein, the effective refractive index refers to the substantial reference index of the entire patterned structures 325, with the trenched substrate and the members filling the trenches combined. For example, if the semiconductor layer 301 is formed of Si having a refractive index of 4 and the interlayer film 322 is formed of Sit) having a refractive index of 1.5, the patterned structures 325 have an effective refractive index of 2.8 to 3.8. The antireflection film 326 is formed of $Ta_2O_5$, for example, with a refractive index of approximately 2. Disposing the antireflection film 326 between the semiconductor layer 301 and the interlayer film 322 can smoothen changes in the refractive index from the semiconductor layer 301 to the interlayer film 322. This can prevent the avalanche-emitted light from being reflected at the backside of the semiconductor layer 301 and reduce crosstalk due to the avalanche-emitted light.

Disposing the light shielding portions 327 between the pixels can reduce crosstalk because the avalanche-emitted light occurring in each pixel exits the pixel without entering an adjoining pixel.

As illustrated in FIG. 19B the patterned structures 325 according to the present exemplary embodiment are formed with a density distribution not uniform within the respective pixels. Specifically, in each pixel, the trench density is lowered in the peripheral areas of the pixel where the intensity distribution of the avalanche-emitted light is low. This can reduce the area occupancy ratio of the trenches to the entire pixel. Since the trenched portions can be a source of a dark current due to damages caused to the semiconductor layer 301 by etching, crosstalk can be reduced and the DCR can be lowered by reducing the area occupancy ratio of the trenches.

A photoelectric conversion apparatus according to a fifth exemplary embodiment will be described with reference to FIG. 21.

A description of parts common with the first to fourth exemplary embodiments will be omitted, and differences from the first exemplary embodiment will mainly be described.

Figure 21:
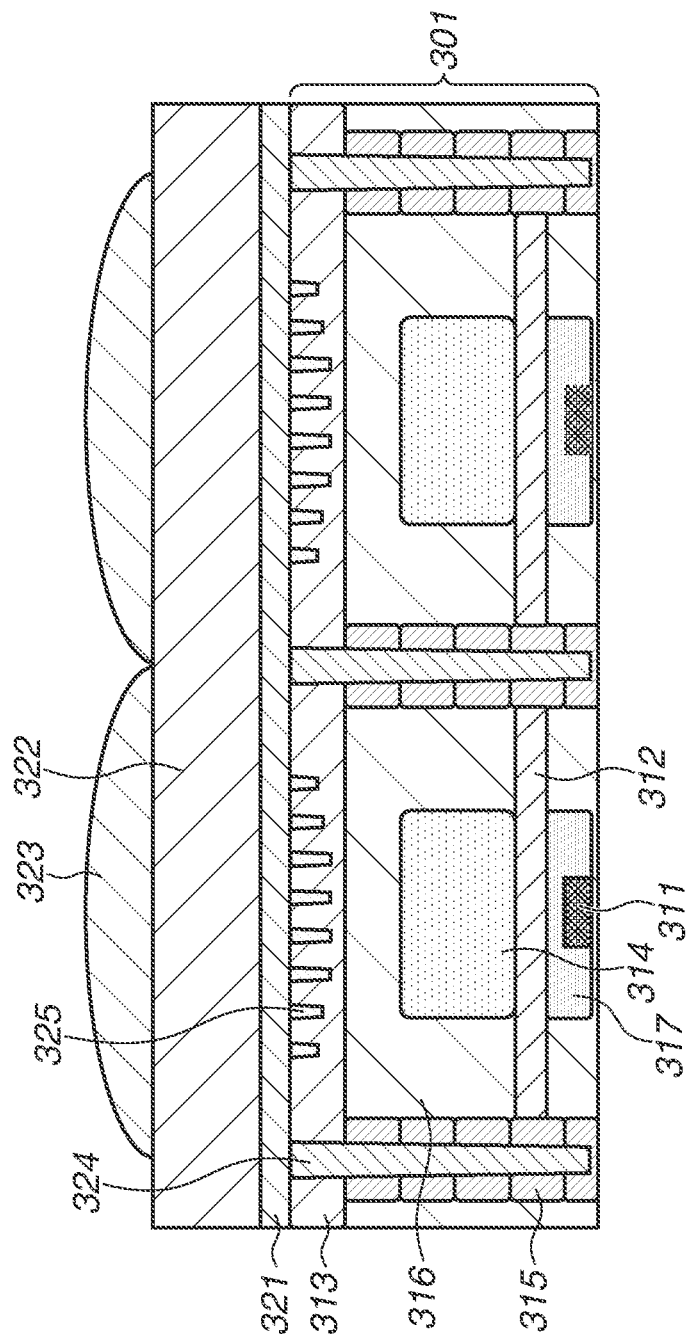
FIG. 21 is a sectional view of photoelectric conversion elements according to a fifth exemplary embodiment.

FIG. 21 is a sectional view of pixels of the photoelectric conversion apparatus according to the fifth exemplary embodiment.

In the photoelectric conversion apparatus according to the fifth exemplary embodiment, patterned structures 325 include trenches of different depths. In the pixels illustrated in FIG. 21, trenches near the pixel centers where the intensity of the avalanche-emitted light is high are formed with a depth of 0.1 to 0.6 μm, for example. Trenches near the outer peripheries of the pixels where the intensity of the avalanche-emitted light is low are relatively shallowly formed.

The formation of the patterned structures 325 including a plurality of trenches of different depths can intensively reduce the reflection of the avalanche-emitted light near the pixel centers where the avalanche-emitted light concentrates intensely, and reduce crosstalk. Since the total volume of the patterned structures 325 can be reduced, the occurrence of a dark current is reduced to prevent deterioration in the DCR.

A photoelectric conversion apparatus according to a sixth exemplary embodiment will be described with reference to FIGS. 22A to 22C.

A description of parts common with the first to fifth exemplary embodiments will be omitted, and differences from the first exemplary embodiment will mainly be described.

Figure 22A:
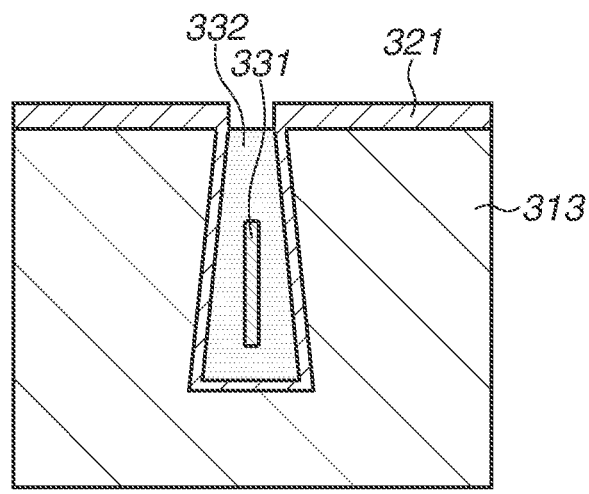
FIGS. 22A, 22B, and 22C are sectional views of a trench structure of a photoelectric conversion element according to a sixth exemplary embodiment.

The sectional shape of the trenches constituting the patterned structures 325 is not limited to the sectional shape illustrated in FIG. 8, For example, as illustrated in FIG. 22A, the trenches may have an inverse tapered shape narrow on the light incident surface side and wide on the side near the surface opposite the light incident surface, Forming the trenches constituting the patterned structure 325 in such a shape can strengthen the diffraction effect and improve the sensitivity.

Figure 22B:
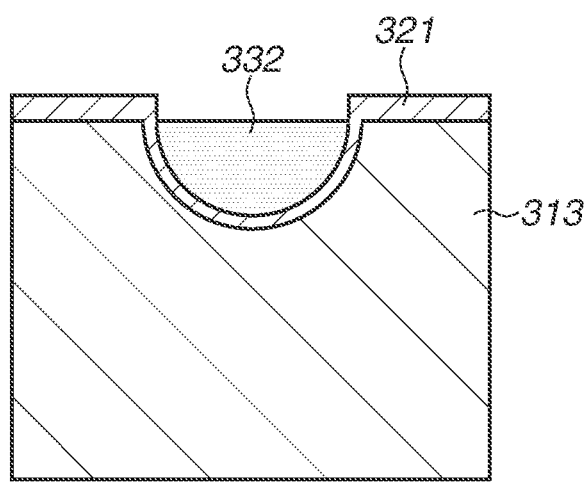

The trenches constituting the patterned structures 325 may have a hemispherical shape as illustrated in FIG. 22B. This can reduce sharp changes in refractive index to provide an antireflection effect for improved sensitivity. While FIG. 22B illustrates a hemisphere having a semicircular cross section with a center angle of 180°, similar effects can be obtained with any shape with an arcuate cross section.

Figure 22C:
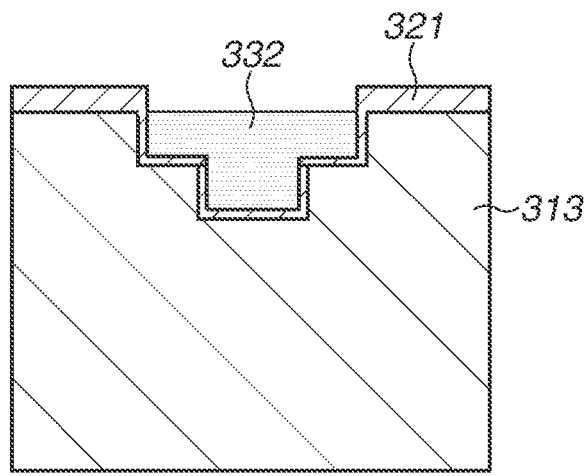

Step-like trenches such as illustrated in FIG. 22C can similarly reduce sharp changes in refractive index to provide an antireflection effect for improved sensitivity. While FIG. 22C illustrates a step-like trench with two planes parallel to the light incident surface, the number of planes (number of steps) is not limited thereto.

A photoelectric conversion apparatus according to a seventh exemplary embodiment will be described with reference to FIGS. 23, 24A, and 24B.

A description of parts common with the first to sixth exemplary embodiments will be omitted, and differences from the first exemplary embodiment will mainly be described.

Figure 23:
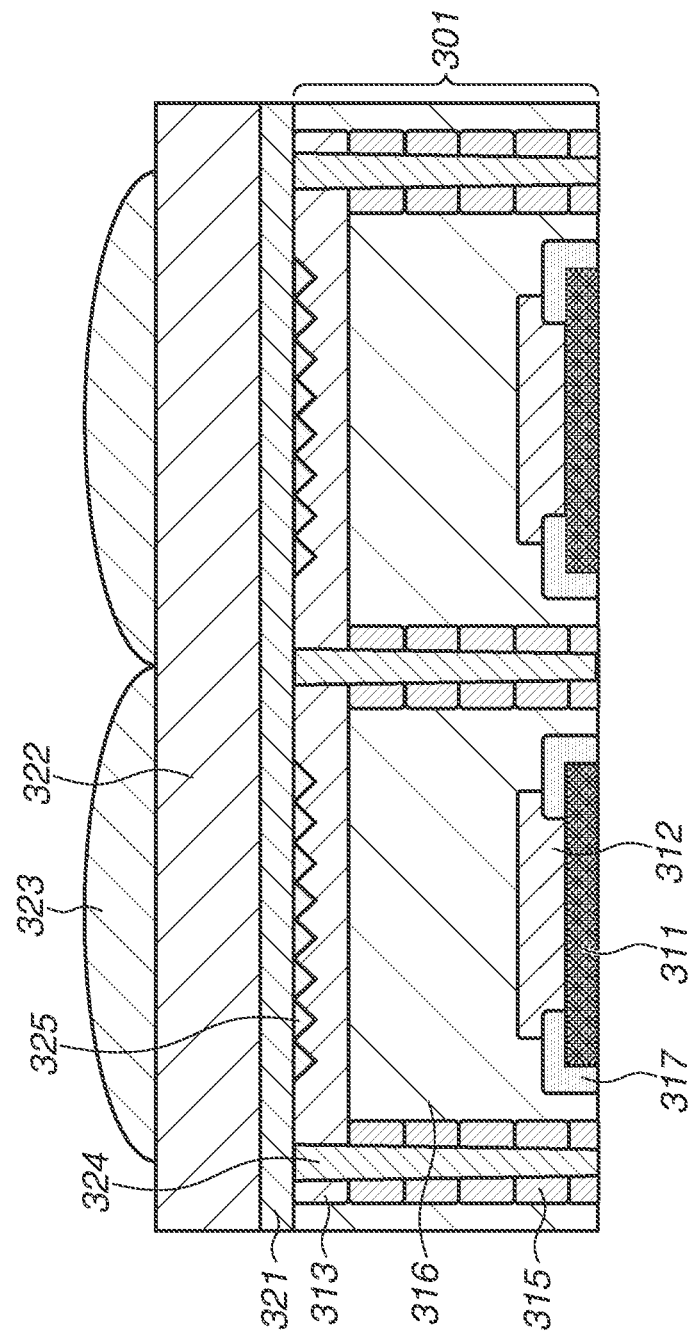
FIG. 23 is a sectional view of photoelectric conversion elements according to a seventh exemplary embodiment.

FIG. 23 is a sectional view of photoelectric conversion elements 102 of the photoelectric conversion apparatus according to the seventh exemplary embodiment, taken along a direction perpendicular to the planar direction of the semiconductor layer, In the photoelectric conversion apparatus according to the present exemplary embodiment, the N-type first semiconductor regions 311 occupy a large proportion of the light receiving surfaces of the pixels as compared to the photoelectric conversion apparatus 100 according to the first exemplary embodiment. The seventh semiconductor regions 317 are disposed between the first semiconductor regions 311 and the second semiconductor regions 312.

The patterned structures 325 include trenches of rectangular pyramidal shape, having a triangular cross section with the light incident surface at the bottom.

Figure 24A:
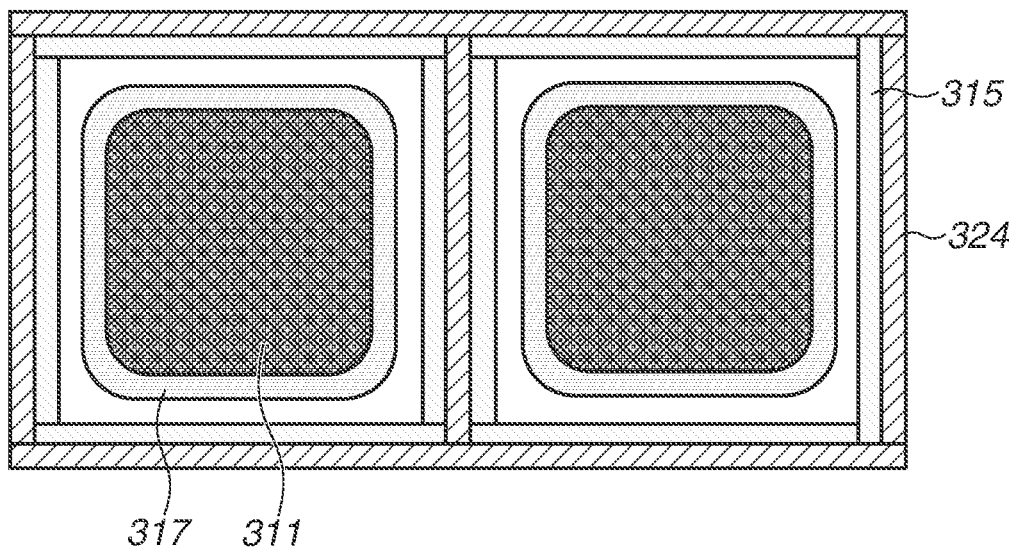
FIGS. 24A and 24B are plan views of the photoelectric conversion elements according to the seventh exemplary embodiment.
Figure 24B:
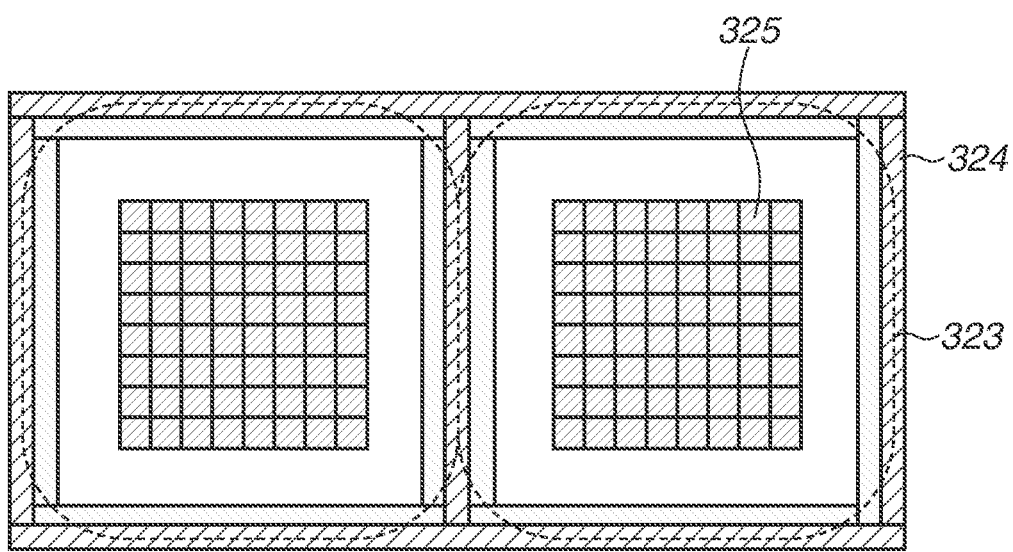

FIGS. 24A and 24B are plan views of two pixels of the photoelectric conversion apparatus according to the seventh exemplary embodiment. FIG. 24A is a plan view from the surface opposite the light incident surface. FIG. 24B is a plan view from the light incident surface side.

In the plan view from the light incident surface side, the seventh semiconductor regions 317 are located between the first and second semiconductor regions 311 and 312. The incident light is avalanche-multiplied between the first and second semiconductor regions 311 and 312, If pixel openings are designed to expose the first and second semiconductor regions 311 and 312 to light, the opening ratio of the photoelectric conversion apparatus according to the present exemplary embodiment is lower than those of the photoelectric conversion apparatuses according to the first to fifth exemplary embodiments. The low opening ratio can reduce the volume of photoelectric conversion regions capable of signal detection and can thus reduce crosstalk.

Figure 25:
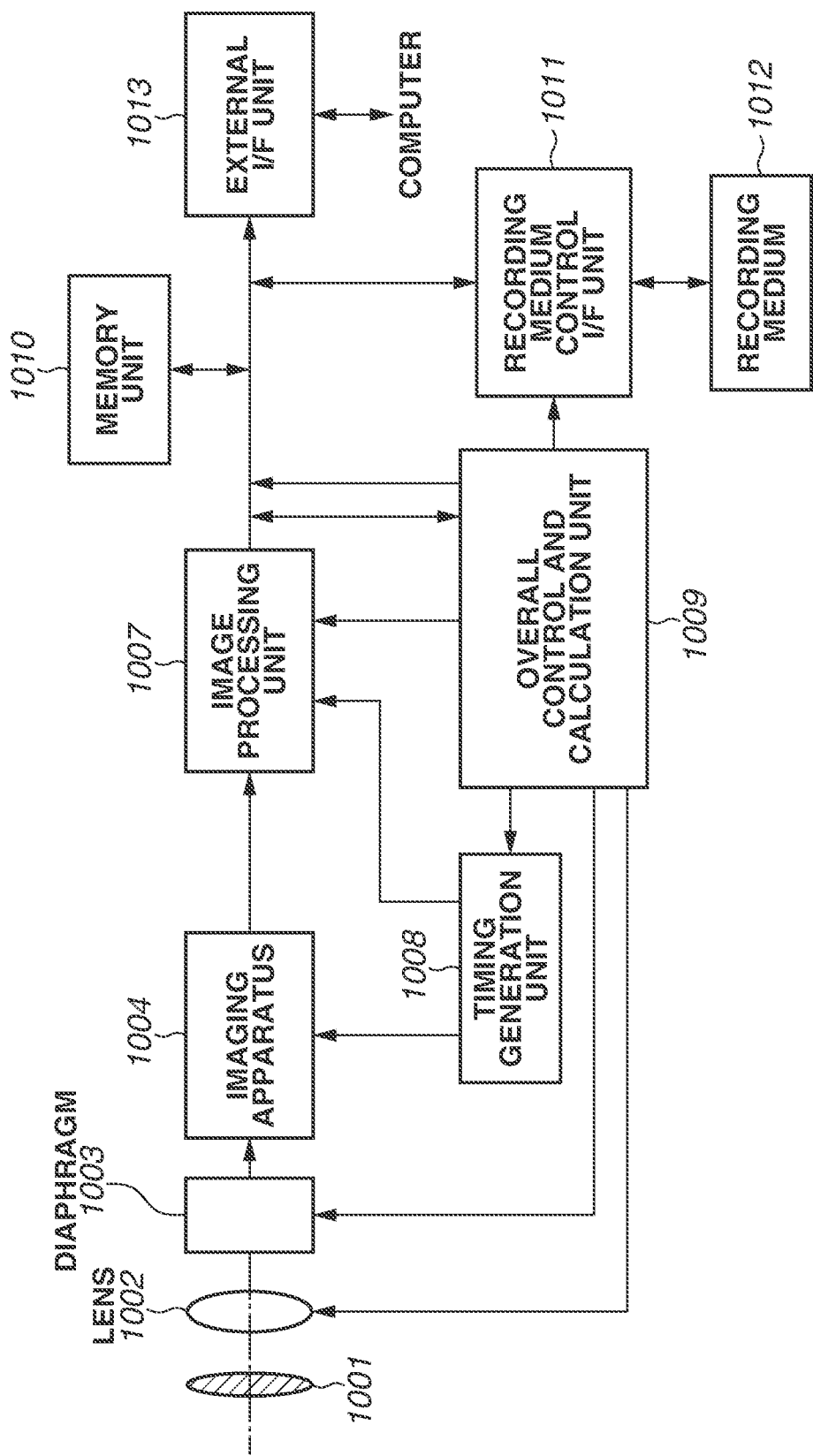
FIG. 25 is a functional block diagram of a photoelectric conversion system according to an eighth exemplary embodiment.

A photoelectric conversion system according to an eighth exemplary embodiment will be described with reference to FIG. 25. FIG. 25 is a block diagram illustrating a schematic configuration of the photoelectric conversion system according to the present exemplary embodiment.

The photoelectric conversion apparatuses described in the foregoing first to seventh exemplary embodiments can be applied to various photoelectric conversion systems. Examples of the applicable photoelectric conversion systems include a digital still camera, a digital camcorder, a surveillance camera, a copying machine, a facsimile, a mobile phone, an on-vehicle camera, and an observation satellite. A camera module including an optical system, such as a lens, and an imaging apparatus is also included in the photoelectric conversion systems. As an example, FIG. 25 illustrates a block diagram of a digital still camera.

The photoelectric conversion system illustrated in FIG. 25 includes an imaging apparatus 1004 that is an example of a photoelectric conversion apparatus, and a lens 1002 for forming an optical image of an object on the imaging apparatus 1004, The photoelectric conversion system further includes a diaphragm 1003 for changing the amount of light passing through the lens 1002, and a barrier 1001 for protecting the lens 1002. The lens 1002 and the diaphragm 1003 constitute an optical system for collecting light to the imaging apparatus 1004. The imaging apparatus 1004 is the photoelectric conversion apparatus according to any one of the foregoing exemplary embodiments, and converts the optical image formed by the lens 1002 into an electrical signal.

The photoelectric conversion system also includes a signal processing unit 1007 that is an image generation unit for generating an image by processing the output signal (electrical signal) output from the imaging apparatus 1004. The signal processing unit 1007 performs an operation for making various corrections and compressions as appropriate and outputting image data. The signal processing unit 1007 may be formed on a semiconductor substrate where the imaging apparatus 1004 is disposed, or on a semiconductor substrate different from the one with the imaging apparatus 1004.

The photoelectric conversion system Father includes a memory unit 1010 for temporarily storing the image data, and an external interface (I/F) unit 1013 for communicating with an external computer. The photoelectric conversion system further includes a recording medium 1012 for recording and reading imaging data, such as a semiconductor memory, and a recording medium control I/F unit 1011 for performing recording and reading on the recording medium 1012. The recording medium 1012 may be built in the photoelectric conversion system, or detachably attachable to the photoelectric conversion system.

The photoelectric conversion system further includes an overall control and calculation unit 1009 that controls various calculations and the entire digital still camera, and a timing generation unit 1008 that outputs various timing signals to the imaging apparatus 1004 and the signal processing unit 1007. The timing signals may be input from the outside of the system. The photoelectric conversion system includes at least the imaging apparatus 1004 and the signal processing unit 1007 that processes the output signal output from the imaging apparatus 1004.

The imaging apparatus 1004 outputs an imaging signal to the signal processing unit 1007. The signal processing unit 1007 applies predetermined signal processing to the imaging signal output from the imaging apparatus 1004, and outputs image data. The signal processing unit 1007 generates an image using the imaging signal.

As described above, according to the present exemplary embodiment, a photoelectric conversion system to which the photoelectric conversion apparatus (imaging apparatus) according to any one of the foregoing exemplary embodiments is applied can be implemented.

Figure 26A:
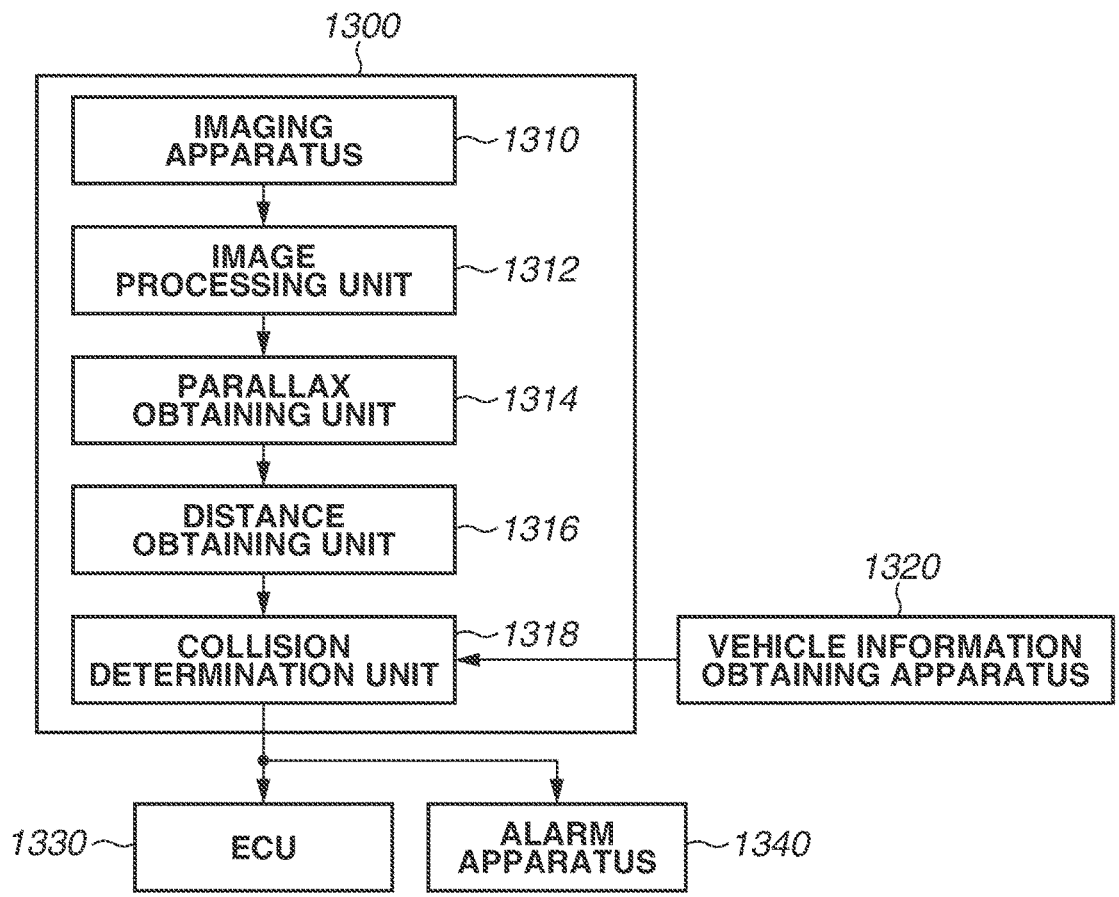
FIGS. 26A and 26B are functional block diagrams of a photoelectric conversion system according to a ninth exemplary embodiment.
Figure 26B:
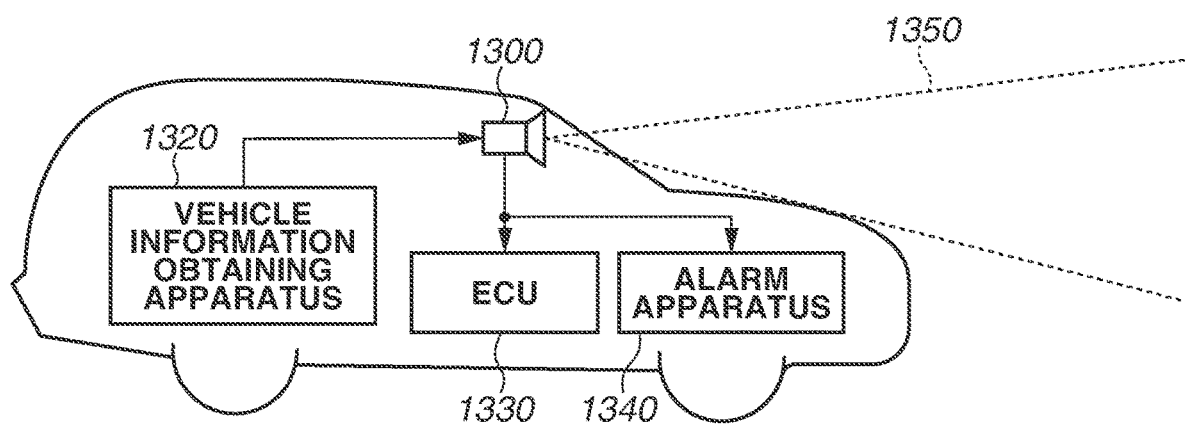

A photoelectric conversion system and a moving body according to a ninth exemplary embodiment will be described with reference to FIGS. 26A and 26B. FIGS. 26A and 26B are diagrams illustrating configurations of the photoelectric conversion system and the moving body according to the present exemplary embodiment.

FIG. 26A illustrates an example of a photoelectric conversion system related to an on-vehicle camera, A photoelectric conversion system 1300 includes an imaging apparatus 1310. The imaging apparatus 1310 is the photoelectric conversion apparatus described in any one of the foregoing exemplary embodiments. The photoelectric conversion system 1300 includes an image processing unit 1312 that performs image processing on a plurality of pieces of image data obtained by the imaging apparatus 1310, and a parallax obtaining unit 1314 that calculates a parallax (phase difference between parallax images) from a plurality of pieces of image data obtained by the photoelectric conversion system 1300. The photoelectric conversion system 1300 also includes a distance obtaining unit 1316 that calculates a distance to a target object based on the calculated parallax, and a collision determination unit 1318 that determines whether there is a possibility of collision based on the calculated distance. Here, the parallax obtaining unit 1314 and the distance obtaining unit 1316 are examples of a distance information obtaining unit that obtains distance information about the target object. In other words, distance information refers to information about a parallax, a defocus amount, the distance to the target object, etc. The collision determination unit 1318 may determine the possibility of collision based on any one of the pieces of distance information. The distance information obtaining unit may be implemented by dedicatedly designed hardware or by a software module.

Alternatively, the distance information obtaining unit may be implemented using a field programmable gate array (FPGA) or an application specific integrated circuit (ASIC). The distance information obtaining unit may be implemented by a combination of these.

The photoelectric conversion system 1300 is connected to a vehicle information obtaining apparatus 1320, and can obtain vehicle information such as a vehicle speed, a yaw rate, and a steering angle. The photoelectric conversion system 1300 is also connected to an electronic control unit (ECU) 1330 that is a control unit for outputting a control signal for causing the vehicle to produce braking force based on the result of the determination made by the collision determination unit 1318. The photoelectric conversion system 1300 is also connected to an alarm apparatus 1340 that issues an alarm to the driver based on the result of the determination made by the collision determination unit 1318. For example, if the result of the determination made by the collision determination unit 1318 shows a high possibility of collision, the ECU 1330 performs vehicle control to avoid collision or reduce damage by putting the brakes on, easing the gas pedal, and/or reducing engine output. The alarm apparatus 1340 warns the user by issuing an alarm sound, displaying alarm information on a screen of a car navigation system, and/or vibrating the seat belt or the steering wheel.

In the present exemplary embodiment, the photoelectric conversion system 1300 captures images around the vehicle, e.g., in front of or behind the vehicle. FIG. 269 illustrates the photoelectric conversion system that captures images in front of the vehicle (imaging range 1350). The vehicle information obtaining apparatus 1320 transmits instructions to the photoelectric conversion system 1300 or the imaging apparatus 1310. With such a configuration, the accuracy of distance measurement can be further improved.

While the foregoing photoelectric conversion system is described to perform control for avoiding collision with another vehicle, the photoelectric conversion system can also be applied to automatic driving control for following another vehicle or automatic driving control for staying in the lane. Moreover, the photoelectric conversion system is not limited to a vehicle such as an automobile, and can be also applied to moving bodies (moving apparatuses) such as a ship, an aircraft, and an industrial robot. The photoelectric conversion system is not limited to a moving body, either, and can be widely applied to equipment using object recognition, such as an intelligent transport system (ITS).

Figure 27:
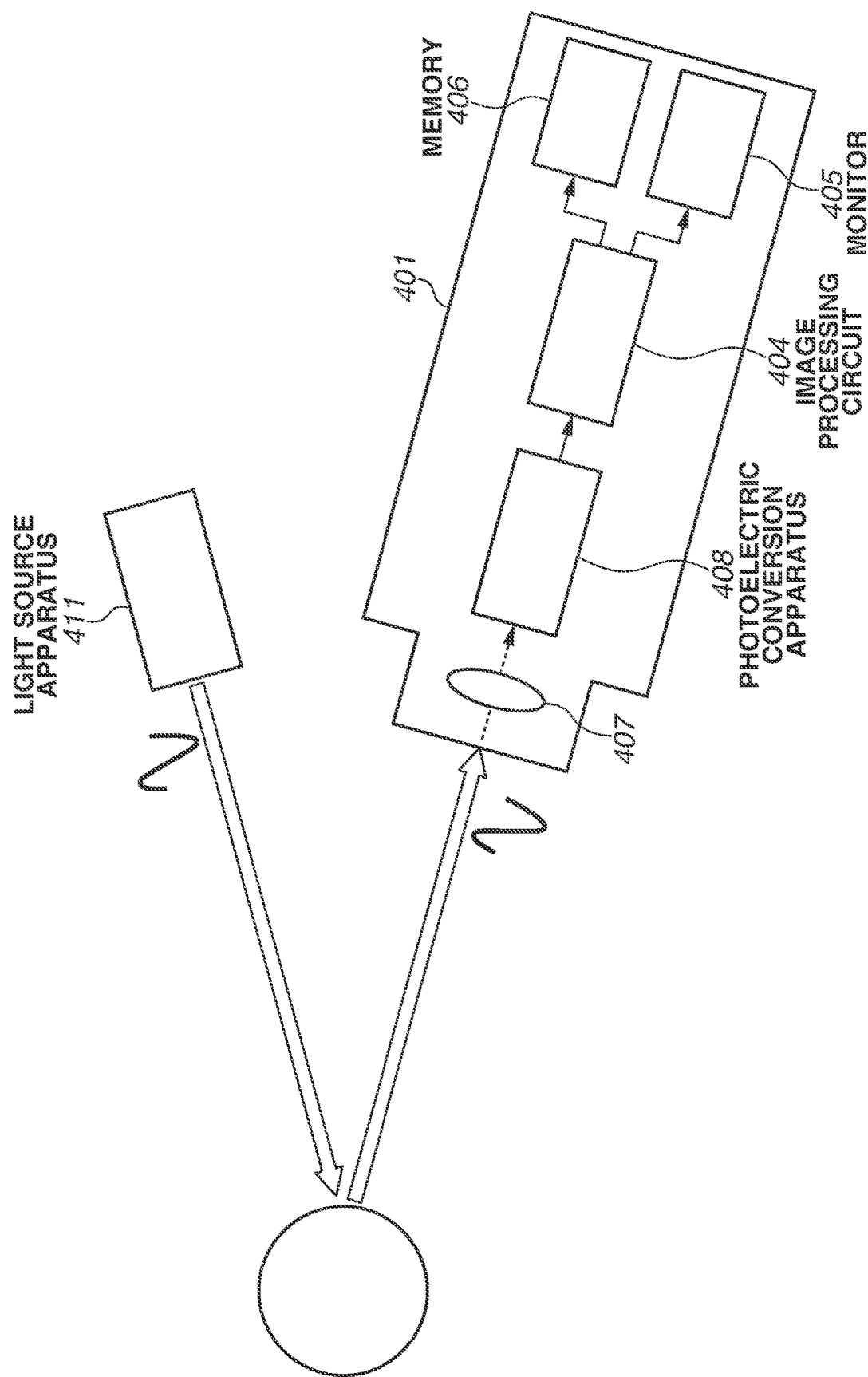
FIG. 27 is a functional block diagram of a photoelectric conversion system according to a tenth exemplary embodiment.

A photoelectric conversion system according to a tenth exemplary embodiment will be described with reference to FIG. 27. FIG. 27 is a block diagram illustrating a configuration example of a distance image sensor that is the photoelectric conversion system according to the present exemplary embodiment.

As illustrated in FIG. 27, a distance image sensor 401 includes an optical system 407, a photoelectric conversion apparatus 408, an image processing circuit 404, a monitor 405, and a memory 406. The distance image sensor 401 can obtain a distance image based on a distance to an object by receiving light (modulated light or pulsed light) that is projected from a light source apparatus 411 upon the object and reflected at the surface of the object.

The optical system 407 includes one or a plurality of lenses. The optical system 407 guides the image light (incident light) from the object to the photoelectric conversion apparatus 408 and forms an image on the light receiving surface (sensor unit) of the photoelectric conversion apparatus 408.

Any one of the photoelectric conversion apparatuses according to the foregoing exemplary embodiments is applied as the photoelectric conversion apparatus 408. A distance signal indicating a distance determined from a light reception signal output from the photoelectric conversion apparatus 408 is supplied to the image processing circuit 404.

The image processing circuit 404 performs image processing for constructing a distance image based on the distance signal supplied from the photoelectric conversion apparatus 408. The distance image (image data) obtained by the image processing is supplied to and displayed on the monitor 405, or supplied to and stored (recorded) in the memory 406.

The distance image sensor 401 configured thus can obtain, for example, a more accurate distance image by virtue of improvement in pixel characteristics by the application of the foregoing photoelectric conversion apparatus.

A photoelectric conversion system according to an eleventh exemplary embodiment will be described with reference to FIG. 28. FIG. 28 is a diagram illustrating an example of a schematic configuration of an endoscopic surgery system that is the photoelectric conversion system according to the present exemplary embodiment.

FIG. 28 illustrates a state where an operator (doctor) 1131 is performing an operation on a patient 1132 on a patient bed 1133 using an endoscopic surgery system 1150. As illustrated in the diagram, the endoscopic surgery system 1150 includes an endoscope 1100, a surgical tool 1110, and a cart 1134 on which various apparatuses for endoscopic surgery are mounted.

The endoscope 1100 includes a lens barrel 1101 and a camera head 1102 connected to the base end of the lens barrel 1101. The lens barrel 1101 is inserted into a body cavity of the patient 1132 by predetermined length from the tip thereof. While the illustrated endoscope 1100 is configured as a hard endoscope including a hard lens barrel 1101, the endoscope 1100 may be configured as a flexible endoscope including a flexible lens barrel.

The tip of the lens barrel 1101 has an opening to which an object lens is fitted, A light source apparatus 1203 is connected to the endoscope 1100. Light generated by the light source apparatus 1203 is guided to the tip of the lens barrel 1101 by a light guide extended through the lens barrel 1101, and emitted toward an observation target in the body cavity of the patient 1132 via the object lens. The endoscope 1100 may be a forward-viewing endoscope, a forward-oblique view endoscope, or a side-viewing endoscope.

An optical system and a photoelectric conversion apparatus are disposed in the camera head 1102. Reflected light (observation light) from the observation target is collected to the photoelectric conversion apparatus by the optical system. The photoelectric conversion apparatus photoelectrically converts the observation light to generate an electrical signal corresponding to the observation light, i.e., an image signal corresponding to an observation image. Any one of the photoelectric conversion apparatuses described in the foregoing exemplary embodiments can be used as the photoelectric conversion apparatus. The image signal is transmitted as raw data to a camera control unit (CCU) 1135.

The CCU 1135 includes a central processing unit (CPU) and a graphics processing unit (GPU), and controls operation of the endoscope 1100 and a display apparatus 1136 in a centralized manner. Moreover, the CCU 1135 receives the image signal from the camera head 1102, and applies various types of image processing for displaying an image based on the image signal, such as development processing (demosaicing processing), to the image signal.

The display apparatus 1136 displays the image based on the image signal to which the image processing is applied by the CCU 1135 under the control of the CCU 1135.

The light source apparatus 1203 includes a light source such as a light-emitting diode (LED), and supplies illumination light in capturing an image of the surgical site to the endoscope 1100.

An input apparatus 1137 is an input interface for the endoscopic surgery system 1150. The user can input various types of information and instructions to the endoscopic surgery system 1150 via the input apparatus 1137.

A treatment tool control apparatus 1138 controls driving of an energy treatment tool 1112 for cauterizing or incising tissue or sealing blood vessels.

The light source apparatus 1203 that supplies the illumination light in capturing an image of the surgical site to the endoscope 1100 includes, for example, an LED, a laser light source, or a white light source combining these. A white light source including a combination of R, G, and B laser light sources can precisely control the output intensity and output timing of each color (each wavelength). The light source apparatus 1203 can thus adjust the white balance of the captured image. In such a case, images corresponding to respective colors R, G, and B can be captured in a time-division manner by irradiating the observation target with the laser beams from the R, G, and B, respective laser light sources in a time-division manner and controlling the driving of the image sensor in the camera head 1102 in synchronization with the irradiation timing. According to this method, a color image can be obtained without a color filter on the image sensor.

Moreover, the driving of the light source apparatus 1203 may be controlled to change the intensity of the output light at predetermined time intervals. A high dynamic range image without underexposure or overexposure can be generated by controlling the driving of the image sensor in the camera head 1102 in synchronization with the timing of changes in the light intensity to obtain images in a time-division manner and combining the images.

The light source apparatus 1203 may be configured so that light of a predetermined wavelength band intended for special light observation can be supplied, Special light observation uses the wavelength dependence of light absorption by body tissue, for example, Specifically, an image of predetermined tissue such as blood vessels in the mucosal surface layer is captured with high contrast by emitting light of a narrower band than that of the illumination light during normal observation (i.e., white light).

Alternatively, fluorescence observation for obtaining an image using fluorescence caused by excitation light irradiation may be performed as special light observation. Fluorescence observation includes irradiating body tissue with excitation fight and observing fluorescence from the body tissue, A fluorescence image can be obtained by locally injecting a reagent such as indocyanine green (ICG) into body tissue and irradiating the body tissue with excitation light corresponding to the fluorescence wavelength of the reagent. The light source apparatus 1203 can be configured so that narrow-band light and/or excitation light intended for such a special light observation can be supplied.

Figure 29A:
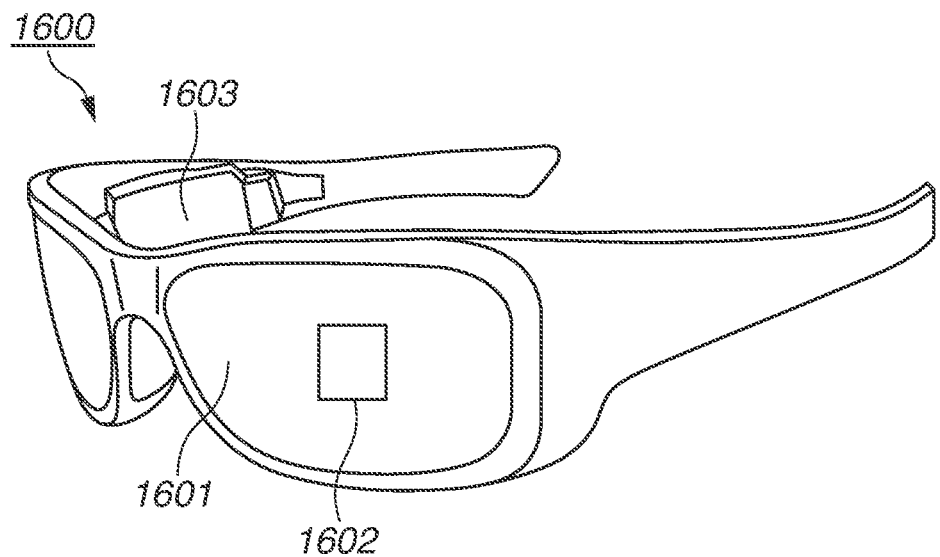
FIGS. 29A and 29B are perspective views of a photoelectric conversion systems according to a twelfth exemplary embodiment.

A photoelectric conversion apparatus according to a twelfth exemplary embodiment will be described with reference to FIGS. 29A and 29B. FIG. 29A illustrates glasses 1600 (smart glasses) that are the photoelectric conversion system according to the present exemplary embodiment. The glasses 1600 include a photoelectric conversion apparatus 1602. The photoelectric conversion apparatus 1602 is any one of the photoelectric conversion apparatuses described in the foregoing exemplary embodiments, A display apparatus including a light emission device such as an organic light-emitting diode (OLED) and an LED may be disposed on the backside of a lens 1601. The glasses 1600 may include one or a plurality of photoelectric conversion apparatuses 1602. A plurality of types of photoelectric conversion apparatuses may be used in combination. The installation position of the photoelectric conversion apparatus 1602 is not limited to that illustrated in FIG. 29A.

The glasses 1600 further include a control apparatus 1603. The control apparatus 1603 functions as a power supply for supplying power to the photoelectric conversion apparatus 1602 and the display apparatus mentioned above. The control apparatus 1603 also controls operation of the photoelectric conversion apparatus 1602 and the display apparatus. The lens 1601 includes an optical system for collecting light to the photoelectric conversion apparatus 1602.

Figure 29B:
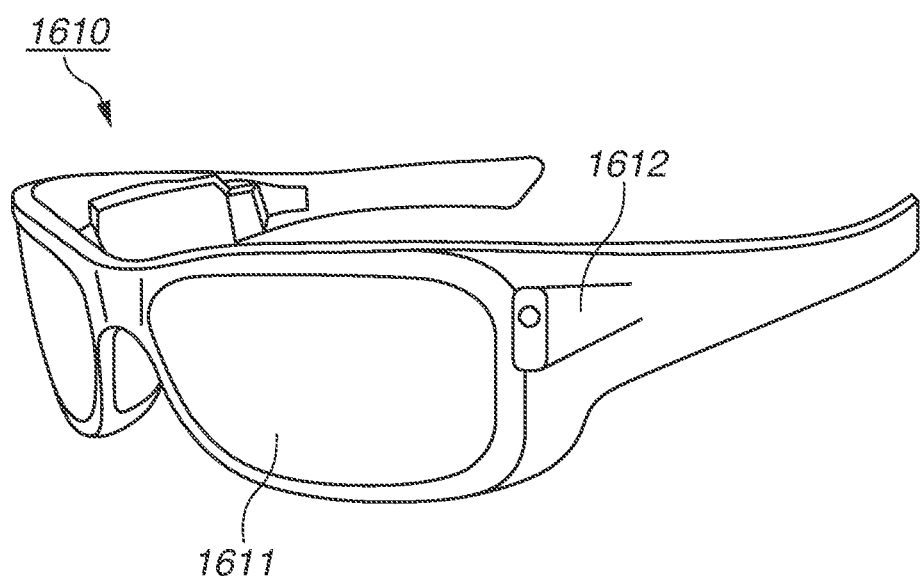

FIG. 29B illustrates glasses 1610 (smart glasses) according to an application example. The glasses 1610 include a control apparatus 1612. The control apparatus 1612 includes a photoelectric conversion apparatus equivalent to the photoelectric conversion apparatus 1602 and a display apparatus. A lens 1611 includes the optical system of the photoelectric conversion apparatus in the control apparatus 1612 and an optical system for projecting light emitted from the display apparatus, and an image is projected on the lens 1611. The control apparatus 1612 functions as a power supply for supplying power to the photoelectric conversion apparatus and the display apparatus, and controls operation of the photoelectric conversion apparatus and the display apparatus. The control apparatus 1612 may include a line of sight detection unit for detecting the line of sight of the wearer (user). The line of sight may be detected by using infrared rays. An infrared emission unit emits infrared rays toward the eyeball of the user gazing at the projected image (display image). An imaging unit including a light receiving element detects the reflection of the emitted infrared rays from the eyeball to obtain a captured image of the eyeball. A reduction unit for reducing the infrared rays traveling from the infrared emission unit to the lens 1611 is included to reduce a drop in image quality.

The user's line of sight to the display image is detected from the captured image of the eyeball obtained by the infrared imaging. Any conventional technique can be applied to detect the line of sight from the captured image of the eyeball. For example, a line of sight detection method based on a Purkinje image obtained from the reflection of illumination light at the cornea can be used.

More specifically, line of sight detection processing based on a pupil-corneal reflection method is performed. Using the pupil-corneal reflection method, the user's line of sight is detected by calculating a line of sight vector representing the direction (rotation angle) of the eyeball based on the image of the pupil and the Purkinje image included in the captured image of the eyeball.

The display apparatus according to the present exemplary embodiment may include a photoelectric conversion apparatus including a light receiving element, and control the display image of the display apparatus based on the user's line of sight information from the photoelectric conversion apparatus.

Specifically, the display apparatus determines a first field of view region gazed at by the user and a second field of view region other than the first field of view region based on the line of sight information. The first field of view region and the second field of view region may be determined by a control unit of the display apparatus. The first and second field of view regions determined by an external control apparatus may be received. The display resolution of the first field of view region in the display area of the display apparatus may be controlled to be higher than that of the second field of view region. In other words, the resolution of the second field of view region may be made lower than that of the first field of view region.

The display area may include a first display region and a second display region different from the first display region, and one having the higher priority between the first and second display regions may be determined based on the line of sight information. The first display region and the second display region may be determined by the control unit of the display apparatus. The first and second display regions determined by an external control apparatus may be received. The resolution of the region having the higher priority may be controlled to be higher than that of the region other than the region having the higher priority. In other words, the resolution of the region having the relatively lower priority may be reduced.

The first field of view region or the region having the higher priority may be determined using artificial intelligence (AI). The AI may be a model trained to estimate the angle of the line of sight and the distance to an object in front of the line of sight based on the image of the eyeball, using images of eyeballs and the actual directions where the eyeballs are pointing in the images as teaching data. An AI program may be included in the display apparatus, the photoelectric conversion apparatus, or an external apparatus. If the AI program is included in an external apparatus, the estimation result is notified to the display apparatus by communication.

If the display is controlled based on visual recognition detection, the present exemplary embodiment can be suitably applied to smart glasses further including a photoelectric conversion apparatus for capturing an external image. The smart glasses can display captured external information in real time.

Modified Exemplary Embodiments

The disclosure is not limited to the foregoing exemplary embodiments, and various modifications can be made.

For example, part of the configuration of one of the exemplary embodiments may be added to another exemplary embodiment, or replaced with part of the configuration of another exemplary embodiment. Such modifications are also included in the exemplary embodiments of the disclosure.

The photoelectric conversion systems described in the foregoing seventh and eighth exemplary embodiments are examples of photoelectric conversion systems to which a photoelectric conversion apparatus can be applied. Photoelectric conversion systems to which a photoelectric conversion apparatus according to an exemplary embodiment of the disclosure can be applied is not limited to the configurations illustrated in FIGS. 25 to 26B, The same applies to the ToF system described in the tenth exemplary embodiment, the endoscopic described in the eleventh exemplary embodiment, and the smart glasses described in the twelfth exemplary embodiment.

All of the foregoing exemplary embodiments are merely examples of embodiment in carrying out the disclosure, and the interpretation of the technical scope of the disclosure should not be limited thereto. In other words, the disclosure can be practiced in various forms without departing from the technical concept or essential features thereof.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-144928, filed Sep. 6, 2021, which is hereby incorporated by reference herein in its entirety.

What is claimed is:

1. An apparatus comprising a plurality of avalanche diodes disposed in a layer having a first surface and a second surface opposite the first surface,
   wherein the plurality of avalanche diodes each includes a first region of first conductivity type located at a first depth, a second region of second conductivity type located at a second depth greater than the first depth with respect to the second surface, and a third region of the second conductivity type located at a third depth greater than the second depth with respect to the second surface,
   wherein the layer includes a plurality of structures disposed in the first surface, and wherein the plurality, of structures has an effective period less than $hc/E_a$ (h: Planck's constant [J·s], c: speed of light [m/s], and $E_a$: a band gap of a substrate [J]).

2. The apparatus according to claim 1,
wherein the plurality of structures includes a trench structure, and
wherein the trench structure has a width less than $hc/2E_a$.

3. An apparatus comprising a plurality of avalanche diodes disposed in a layer having a first surface and a second surface opposite the first surface,
wherein the plurality of avalanche diodes each includes a first region of first conductivity type located at a first depth, a second region of second conductivity type located at a second depth greater than the first depth with respect to the second surface, and a third region of the second conductivity type located at a third depth greater than the second depth with respect to the second surface,
wherein the layer includes a plurality of structures disposed in the first surface, and
wherein the plurality, of structures has an effective period less than 1.1 μm.

4. The apparatus according to claim 3,
wherein the plurality of structures includes a trench structure, and
wherein the trench structure has a width less than 0.55 μm.

5. The apparatus according to claim 1,
wherein a fourth region of the first conductivity type is located between the second region and the third region, and
wherein the fourth region has a lower impurity concentration of the first conductivity type than that of the first region.

6. The apparatus according to claim 3,
wherein a fourth region of the first conductivity type is located between the second region and the third region, and
wherein the fourth region has a lower impurity concentration of the first conductivity type than that of the first region.

7. The apparatus according to claim 5, wherein in a plan view in a direction perpendicular to the first surface, an area of the plurality of structures overlapping the fourth region is greater than that of the plurality of structures not overlapping the fourth region.

8. The apparatus according to claim 1,
wherein a fifth region is located at the first depth, the fifth region surrounding the first region in a plan view from the first surface, and
wherein the fifth region has a lower impurity concentration than that of the first region.

9. The apparatus according to claim 8, wherein a potential difference between the first and second regions is greater than that between the second and fifth regions.

10. The apparatus according to claim 1, Therein in a plan view in a direction perpendicular to the first surface, a multiplication region between the first and second regions is covered by the plurality of structures.

11. The apparatus according to claim 10, wherein in the plan view in the direction perpendicular to the first surface, a barycentric position of the plurality of structures is included in the multiplication region.

12. The apparatus according to claim 10,
wherein the plurality of avalanche diodes includes a first avalanche diode and a second avalanche diode adjoining the first avalanche diode, and
wherein a pixel isolation portion is disposed between the first and second avalanche diodes.

13. The apparatus according to claim 12,
wherein the plurality of avalanche diodes includes a third avalanche diode adjoining the second avalanche diode,
wherein a first pixel isolation portion is disposed between the first and second avalanche diodes,
wherein a second pixel isolation portion is disposed between the second and third avalanche diodes, and
wherein the second region of the second avalanche diode extends from the first pixel isolation portion to the second isolation portion in a cross section perpendicular to the first surface.

14. The apparatus according to claim 13, wherein in each of the plurality of avalanche diodes, a distance d from the first surface to the multiplication region satisfies $L\sqrt{2}/4 < d < L \times \sqrt{2}$, where L is a distance from the pixel isolation portion to a nearest pixel isolation portion.

15. The apparatus according to claim 10, further comprising an antireflection film stacked on the first surface side of the plurality of structures,
wherein the antireflection film has a refractive index lower than an effective refractive index of a region sandwiched between a surface of the plurality of structures on the second surface side and the first surface, the region overlapping the multiplication region in the plan view in the direction perpendicular to the first surface.

16. The apparatus according to claim 1, wherein in a plan view in a direction perpendicular to the first surface, the plurality of structures includes a T-shaped trench structure.

17. The apparatus according to claim 1, herein in a plan view in a direction perpendicular to the first surface, the plurality of structures includes non-periodically disposed trench structures.

18. The apparatus according to claim 1, wherein the plurality of structures has a density distribution not uniform within the first surface.

19. The apparatus according to claim 18, wherein a density of the plurality of structures at centers of the avalanche diodes is higher than that of the plurality of structures at peripheral portions of the avalanche diodes.

20. The apparatus according to claim 1, wherein the plurality of structures includes a first structure and a second structure, and a depth from the first surface to a bottom of the first structure is different from a depth from the first surface to a bottom of the second structure.

21. The apparatus according to claim 20, wherein the depth of the first structure from the first surface to the bottom is greater than that of the second structure from the first surface to the bottom, the first structure being disposed in a center portion of each of the avalanche diodes, the second structure being disposed in a peripheral portion of each of the avalanche diodes.

22. The apparatus according to claim 20, wherein a depth of the plurality of structures from the first surface to a bottom at an intersection of a recessed portion extending in a first direction and a recessed portion extending in a second direction is greater than that from the first surface to a bottom of the recessed portion extending in the second direction other than at the intersection with the recessed portion extending in the first direction.

23. The apparatus according to claim 22, wherein the bottom at the intersection is located closer to the first surface than one half of a distance between the first surface and the second surface.

24. The apparatus according to claim 1, wherein the plurality of structures includes a plurality of regions independent in a plan view in a direction perpendicular to the first surface.

25. The apparatus according to claim 1, wherein the plurality of structures includes a void.

26. The apparatus according to claim 3, wherein the plurality of structures includes a void.

27. The apparatus according to claim 1, wherein the plurality of structures includes a pinning film.

28. The apparatus according to claim 1, wherein the effective period of the plurality of structures is less than a wavelength at which the layer has an absorption length equal to a distance from the first surface to a midpoint between the first and second regions.

29. A system comprising:
   the apparatus according to claim 1; and
   a signal processing unit configured to generate an image using a signal output from the apparatus.

30. A moving body comprising:
   the apparatus according to claim 1; and
   a control unit configured to control movement of the moving body using a signal output from the apparatus.

* * * * *